United States Patent
Suzuki

(10) Patent No.: US 9,639,639 B2
(45) Date of Patent: May 2, 2017

(54) LOGIC CIRCUIT EMULATOR AND CONTROL METHOD THEREFOR

(75) Inventor: Noriaki Suzuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1039 days.

(21) Appl. No.: 13/643,604

(22) PCT Filed: Apr. 26, 2011

(86) PCT No.: PCT/JP2011/060148
§ 371 (c)(1),
(2), (4) Date: Oct. 26, 2012

(87) PCT Pub. No.: WO2011/136212
PCT Pub. Date: Nov. 3, 2011

(65) Prior Publication Data
US 2013/0055181 A1    Feb. 28, 2013

(30) Foreign Application Priority Data
Apr. 27, 2010 (JP) ................................. 2010-101910

(51) Int. Cl.
G06F 17/50     (2006.01)
G06F 11/26     (2006.01)
H03K 19/177    (2006.01)

(52) U.S. Cl.
CPC ........ *G06F 17/5027* (2013.01); *G06F 11/261* (2013.01); *G06F 17/5022* (2013.01); *G06F 17/5054* (2013.01); *H03K 19/17744* (2013.01)

(58) Field of Classification Search
None
See application file for complete search history.

(56) References Cited

U.S. PATENT DOCUMENTS 4,782,461 A * 11/1988 Mick ................... G06F 11/3652
                                                    703/28
5,313,618 A *  5/1994 Pawloski ............ G06F 11/3656
                                                    703/28
(Continued)

FOREIGN PATENT DOCUMENTS

JP    H08508599 A    9/1996
JP    H08320804 A    12/1996
(Continued)

OTHER PUBLICATIONS

Japanese Office Action for JP Application No. 2012-512851 mailed on Apr. 7, 2015 with English Translation.

*Primary Examiner* — Kibrom K Gebresilassie

(57) ABSTRACT

A logic circuit emulator comprises multiple sub-systems, in which each sub-system outputs to another one of the sub-systems a permission notification to permit the another sub-system to proceed to next emulation clock cycle depending on whether or not the state of an own sub-circuit has advanced. In case a signal that is output from an own sub-circuit and that is to be sent to a sub-circuit of the other sub-system has changed, each sub-system outputs a transfer request to transfer the signal to the another sub-system before the next emulation clock cycle. In case a signal is not being sent from the own sub-circuit to the sub-circuit of the another sub-system, and a permission notification is received but no transfer request is being received from the other sub-system, a clock signal is output for the own sub-circuit to advance the own sub-circuit to the next emulation clock cycle.

11 Claims, 22 Drawing Sheets

(56) References Cited

U.S. PATENT DOCUMENTS

| | | | | |
|---|---|---|---|---|
| 5,546,568 A * | 8/1996 | Bland | G06F 1/08 | 713/501 |
| 5,596,742 A | 1/1997 | Agarwal et al. | | |
| 5,802,348 A * | 9/1998 | Stewart | G01R 31/3177 | 703/25 |
| 5,841,670 A | 11/1998 | Swoboda | | |
| 5,920,712 A * | 7/1999 | Kuijsten | G06F 17/5027 | 703/23 |
| 5,959,465 A * | 9/1999 | Beat | H03K 19/1772 | 326/39 |
| 6,223,148 B1 * | 4/2001 | Stewart | G01R 31/3177 | 703/25 |
| 6,434,161 B1 * | 8/2002 | Higbee | G06F 13/105 | 370/413 |
| 6,560,573 B1 * | 5/2003 | Scaringella | G06F 11/261 | 703/23 |
| 7,188,060 B1 * | 3/2007 | Adcock | G06F 1/14 | 703/14 |
| 7,472,055 B2 * | 12/2008 | Garcia | G06F 17/5022 | 703/14 |
| 8,407,037 B2 * | 3/2013 | Cai | G06F 17/5022 | 703/13 |
| 8,812,289 B1 * | 8/2014 | Chan | G06F 17/5027 | 703/14 |
| 2001/0010036 A1 * | 7/2001 | Stewart | G01R 31/3177 | 703/23 |
| 2002/0128812 A1 * | 9/2002 | Gooding | G06F 17/5022 | 703/23 |
| 2002/0161568 A1 | 10/2002 | Sample et al. | | |
| 2003/0225560 A1 * | 12/2003 | Garcia | G06F 17/5022 | 703/17 |
| 2003/0225561 A1 * | 12/2003 | Garcia | G06F 17/5022 | 703/17 |
| 2003/0225565 A1 * | 12/2003 | Garcia | G06F 17/5022 | 703/23 |
| 2004/0034841 A1 * | 2/2004 | Reblewski | G06F 17/5027 | 716/117 |
| 2004/0215442 A1 * | 10/2004 | Musselman | G06F 17/5022 | 703/24 |
| 2004/0254778 A1 * | 12/2004 | Laurent | G06F 17/5027 | 703/25 |
| 2005/0055190 A1 | 3/2005 | Hosokawa | | |
| 2005/0131670 A1 * | 6/2005 | Wang | G06F 17/5027 | 703/23 |
| 2007/0189164 A1 * | 8/2007 | Smith | H04L 69/28 | 370/230 |
| 2008/0312900 A1 * | 12/2008 | Akiba | G06F 9/455 | 703/23 |
| 2010/0251235 A1 * | 9/2010 | Ganguly | G06F 9/45558 | 718/1 |
| 2010/0299564 A1 * | 11/2010 | Suzuki | G06F 11/3648 | 714/45 |
| 2010/0321051 A1 * | 12/2010 | Suzuki | G06F 11/3648 | 324/750.3 |
| 2011/0311011 A1 * | 12/2011 | Zhang | H04J 3/0632 | 375/371 |
| 2015/0046144 A1 * | 2/2015 | Suresh | G06F 17/5027 | 703/23 |

FOREIGN PATENT DOCUMENTS

| | | |
|---|---|---|
| JP | 2000-215226 A | 8/2000 |
| JP | 2002507294 A | 3/2002 |
| JP | 2005084957 A | 3/2005 |
| JP | 2008287462 A | 11/2008 |
| WO | 2006/029579 A1 | 12/2006 |

* cited by examiner

PRIOR ART

LOGIC CIRCUIT EMULATOR AND CONTROL METHOD THEREFOR

TECHNICAL FIELD

[Cross-Reference to Related Application]

The present application claims priority of Japanese Patent Application No. 2010-101910 filed on Apr. 27, 2010, the entirety of which is incorporated herein by reference thereto.

This invention relates to a logic circuit emulator and a control method for a logic circuit emulator. More particularly, it relates to a logic circuit emulator including a plurality of subsystems, and a method for controlling a logic circuit emulator.

BACKGROUND

In verification of logic circuits, RTL (Register Transfer Level) simulation by software is frequently used. However, if the target circuit is a large size logic circuit, sufficient verification may not be achieved with RTL simulation because of its low simulation speed. Hence, a logic circuit emulator, in which a logic circuit is configured on an FPGA (Field Programmable Gate Array) and run in this state in operation, is in use.

However, if a logic circuit of an extremely large size is a target, the circuit may not be contained in a single FPGA. In such case, a logic circuit emulator including a plurality of sub-systems (FPGA or emulator boards) may be used. That is, such a method is used in which the logic circuit is partitioned into a plurality of sub-circuits each of which is allocated to one of the sub-systems.

In partitioning a logic circuit as verification target, referred to below as a "verification target circuit," into a plurality of sub-circuits, a circuit partitioning tool provided by CAD (Computer Aided Design) vendor, for example, may be used. Initially, a designer enters the verification target circuit into the circuit partitioning tool, and specifies which portion of the verification target circuit is to be allocated to which one of the multiple sub-circuits. The circuit partitioning tool then estimates the circuit size of each sub-circuit. The verification target circuit is then partitioned into a plurality of sub-circuits so that each partitioned portion of the verification target circuit will be of a size loadable on each sub-system of the logic circuit emulator. These sub-circuits are then loaded on the sub-systems of the logic circuit emulator. Any large sized logic circuits may be verified in this manner by the logic circuit emulator.

In the logic circuit emulator in which the verification target circuit is so partitioned and mounted, limitations are imposed on the number of signal lines between the different sub-systems. Thus, in an emulation system, which makes use of time-multiplexed interconnections, as disclosed in Patent Literature 1, a method of time-multiplexing signals between the different sub-systems is used. In the virtual interconnections for a reconfigurable logic system, as disclosed in Patent Literature 2, a similar method of time-multiplexing signals between the sub-systems is used.

FIG. 16 depicts a block diagram showing the configuration of the emulation system which makes use of the time-multiplexed interconnections disclosed in Patent Literature 1. FIG. 17 depicts a waveform diagram for illustrating an operation of the emulation system which makes use of the time-multiplexed interconnections disclosed in Patent Literature 1.

FIG. 18 depicts a block diagram showing the configuration of virtual interconnections for the reconfigurable logic system disclosed in Patent Literature 2. FIG. 19 depicts a waveform diagram for illustrating an operation of the virtual interconnections for the reconfigurable logic system disclosed in Patent Literature 2.

Referring to FIGS. 17 and 19, the Patent Literatures 1 and 2 use a signal transfer clock which is higher in speed than the emulation clock. Signals are transferred between the different sub-systems at a transfer speed faster than that of the emulation clock to overcome the problem of limitations on the number of signal lines between the different sub-systems.

CITATION LIST

[Patent Literature 1] JP Patent Kohyo Publication No. JP-P2002-507294A

[Patent Literature 2] JP Patent Kohyo Publication No. JP-A-08-508599P

SUMMARY

The disclosures of the above mentioned Patent Literatures are to be incorporated herein by reference thereto. The following analysis is made by the present invention.

If, in the systems of the Patent Literatures 1 and 2, an N-number of signals, N being a natural number, are N-to-1 time-multiplexed and transferred in this state, it is necessary that the transfer speed is N-times the emulation clock speed. However, in these days, the circuit size of the verification target circuit is becoming larger such that it is becoming difficult to increase the number of signals to be transferred between the different sub-systems or to increase the speed of transfer clocks.

It should be noted that signals are not being transferred at all times between the different sub-systems, and not all signals are changed. It may thus be envisaged that, to effect signal transfer, the emulation clock is stopped for a time interval necessary for signal transfer only for the emulation clock cycles during which the signal transfer occurs. If the method to stop the emulation clock for the time interval necessary for signal transfer is used, it is unnecessary for the transfer speed to be N times the emulation clock speed, so that it becomes possible to avoid increasing the transfer clock speed.

If, in a logic circuit emulator, the verification target circuit is partitioned into a plurality of sub-systems to effect verification, it is desirable that the entire emulation clock is globally controlled so that the verification target circuit will be in operation as its integrity is maintained.

FIG. 20 shows a configuration of a legacy logic circuit emulator 100 used in such case. The logic circuit emulator 100 includes a plurality of sub-systems A101 and B102, viz., the logic circuit is verified in a partitioned state. Here, the number of the sub-systems is two, only by way of an example.

Referring to FIG. 20, the logic circuit emulator 100 includes the sub-systems A101 and B102 and a global control circuit 990.

The sub-system A101 includes a controller 301, a transfer signal storing unit 501, a sub-circuit A201 and a transfer signal sending unit 401. The controller 301 includes a clock control unit 931 and a transfer request output unit 321.

In similar manner, the sub-system B102 includes a controller 302, a transfer signal storing unit 502, a sub-circuit B202 and a transfer signal sending unit 402. The controller 302 includes a clock 130 control unit 932 and a transfer request output unit 322.

The global control circuit 990 includes a transfer request receiving unit 991 and a permission notification output unit 992.

The sub-circuits A201, B202 are two sub-circuits obtained on partitioning the verification target circuit, about to be verified by a designer, in two, and on configuring them on the sub-systems A101, B102, respectively. It should be noted that the verification target circuit can be partitioned into a plurality of sub-circuits using an off-the-shelf CAD tool or the like.

The controllers 301, 302 control emulation clocks to run the partitioned verification target circuit in operation as integrity is maintained. The emulation clocks run the sub-circuits A201, B202 in operation.

The transfer signal sending unit 401 receives a transfer signal from the sub-circuit A201 allocated to the sub-system A101. This transfer signal, sent to the sub-circuit B202, allocated to the sub-system B102, is an output signal of the sub-circuit A201, while also being an input signal to the sub-circuit B202. The transfer signal sending unit 401 sends the received transfer signal to the sub-system B 102. On the other hand, the transfer signal sending unit 402 sends a transfer signal from the side the sub-system B102 to the sub-system A101.

The transfer signal storing unit 501 receives the transfer signal from the transfer signal sending unit 402 of the sub-system B102 to hold the received transfer signal as an input to the sub-circuit A201 of the sub-system A101. On the other hand, the transfer signal storing unit 502 receives the transfer signal from the transfer signal sending unit 401 of the sub-system A101 to hold the received transfer signal as an input to the verification target circuit 202 of the sub-system B102.

The operation of the controllers 301, 302 will now be discussed.

The transfer request output units 321, 322 monitor output signals of the sub-circuits A201, B202, respectively. If any of the output signals has changed, the transfer request output units 321, 322 put transfer requests on the global control circuit 990 before the next clock cycle.

During the time when the clock control units 931, 932 have received permission notifications from the global control circuit 990, and when the transfer signal is not being transmitted/received, the clock control units 931, 932 output emulation clocks to advance the states of the sub-circuits A201, B202. On the other hand, during the time when the clock control units 931, 932 have received no permission notifications, or when the transfer signal is being transmitted/received, the clock control units 931, 932 exercise control to stop the emulation clocks.

The operation of the global control circuit 990 will now be discussed.

The transfer request receiving unit 991 receives transfer requests from the transfer request output units 321, 322, configured respectively on the sub-systems A101, B102, respectively.

The permission notification output unit 992 references transfer requests received by the transfer request receiving unit 991. If no transfer request has been put by any of the sub-systems, the permission notification output unit outputs permission notifications to all of the sub-systems.

In the above configuration, in case a transfer request is made between any of the sub-systems, the global control circuit 990 halts all the sub-systems to re-initiate the sub-system operations after the transfer has come to a close.

By the above described technique of halting the emulation clocks for a required time interval, it is possible to avoid the issue of the increasing transfer clock speed.

However, the logic circuit emulator 100, shown in FIG. 20, suffers from the following problems:

First, in the logic circuit emulator 100, shown in FIG. 20, it is not possible to increase the emulation clock speed. If, in the logic circuit emulator 100, shown in FIG. 20, such a signal that stops the emulation clocks during transfer is used, the global control circuit 990 used distributes signals in such a manner that transfer requests from the total of the sub-systems will be collected and the emulation clocks of the total of the sub-systems will be stopped until all transfer has come to a close. In such configuration, the interconnections to collect the transfer request signals from the total of the sub-systems and the interconnections to distribute the clock control signals to the total of the sub-systems tend to be prolonged. It is thus not possible to increase the emulation clock speed.

Second, with the logic circuit emulator 100, shown in FIG. 20, it is not possible to reduce the emulation time. In the configuration of the logic circuit emulator 100, shown in FIG. 20, emulation clocks are stopped until transfer between the total of the sub-systems has come to a close even in case there is such a sub-system where there is no change in the signal value such that it is unnecessary to wait until the end of transfer or in case there is such a sub-system where transfer may be completed in a short time. This indicates that, even if there is such a sub-system where the emulation clock may be progressed, the state of such sub-system may not be advanced until the most time-consuming sub-system-to-sub-system transfer has come to a close, such that it is not possible to reduce the emulation time.

Therefore, there is a need in the art to provide a logic circuit emulator and a control method therefore that increase the emulation clock speed in a logic circuit emulator including a plurality of sub-systems.

SOLUTION TO PROBLEM

According to a first aspect of the present invention, there is provided a logic circuit emulator, comprising:
a plurality of sub-systems each of which is provided with one of a plurality of sub-circuits obtained on partitioning a verification target circuit.
Each of the plurality of sub-systems includes:
a permission notification output unit that determines whether to permit another sub-system to advance to a next emulation clock cycle based at least on whether or not a state of a sub-circuit provided in an own sub-system has advanced, and, in case permission is give, outputs to the another sub-system a permission notification that permits the another sub-system to advance to a next emulation clock cycle; and
a transfer request output unit that, in case a signal that is output from a sub-circuit provided in the own sub-system and that is to be sent to a sub-circuit provided in another sub-system has changed, outputs to the another sub-system before the next emulation clock cycle a transfer request to transfer the signal.
Each of the plurality of the sub-systems includes:
a clock control unit that, in case a signal from the sub-circuit provided in the own sub-system to a sub-circuit provided in another sub-system is not being sent, a permission notification is received but no transfer request is received from the another sub-system, outputs an emulation clock signal for the sub-circuit provided in the own sub-system to advance the sub-circuit provided in the own sub-system to a next emulation clock cycle.

According to a second aspect of the present invention, there is provided a logic circuit emulator, comprising:

a first sub-system provided with a first sub-circuit among a plurality of sub-circuits obtained on partitioning a verification target circuit; and a second sub-system provided with a second sub-circuit [among the plurality of sub-circuits], that sends a signal to or receives a signal from the first sub-circuit.

Each of the first sub-system and the second sub-system includes:

a permission notification output unit that determines whether to permit the other sub-system to advance to a next emulation clock cycle based at least on whether or not a state of a sub-circuit provided in an own sub-system has advanced, and, in case permission is given, outputs to the other sub-system a permission notification; and a transfer request output unit that, in case a change in a signal sent from the sub-circuit provided in one of the first and second sub-systems to the sub-circuit provided in the other sub-system is detected, outputs to the other sub-system thereof before a next emulation clock cycle a transfer request to transfer the signal; and a clock control unit that, in case a permission notification is received and but transfer request is received from the other sub-system, outputs an emulation clock signal to the sub-circuit provided in one of the first and second sub-systems to advance the sub-circuit concerned provided in the one sub-system to a next emulation clock cycle.

According to a third aspect of the present invention, there is provided a method for controlling a logic circuit emulator including a plurality of sub-systems each of which is provided with one of a plurality of sub-circuits obtained on partitioning a verification target circuit. The method comprises:

by each of the plurality of sub-systems, determining whether to permit another sub-system to advance to a next emulation clock cycle based at least on whether or not a state of a sub-circuit provided in one of the sub-systems has advanced, and, in case permission is given, outputting to the another sub-system a permission notification;

in case a signal that is output from the sub-circuit provided in the one of the sub-systems and that is to be sent to the sub-circuit provided in the another sub-system has changed, outputting to the another sub-system, before a next emulation clock cycle, a transfer request to transfer the signal; and in case a signal from the sub-circuit provided in the one of the sub-systems to the sub-circuit provided in the another sub-system is not being sent, the permission notification is received but no transfer request is received from any other sub-system, outputting an emulation clock signal to the sub-circuit provided in the one sub-system to advance the sub-circuit provided in the one sub-system to a next emulation clock cycle.

With the logic circuit emulator and the control method therefor, according to the present invention, it is possible to raise the emulation clock speed in the logic circuit emulator including a plurality of the sub-systems.

PREFERRED MODES

Figure 1:
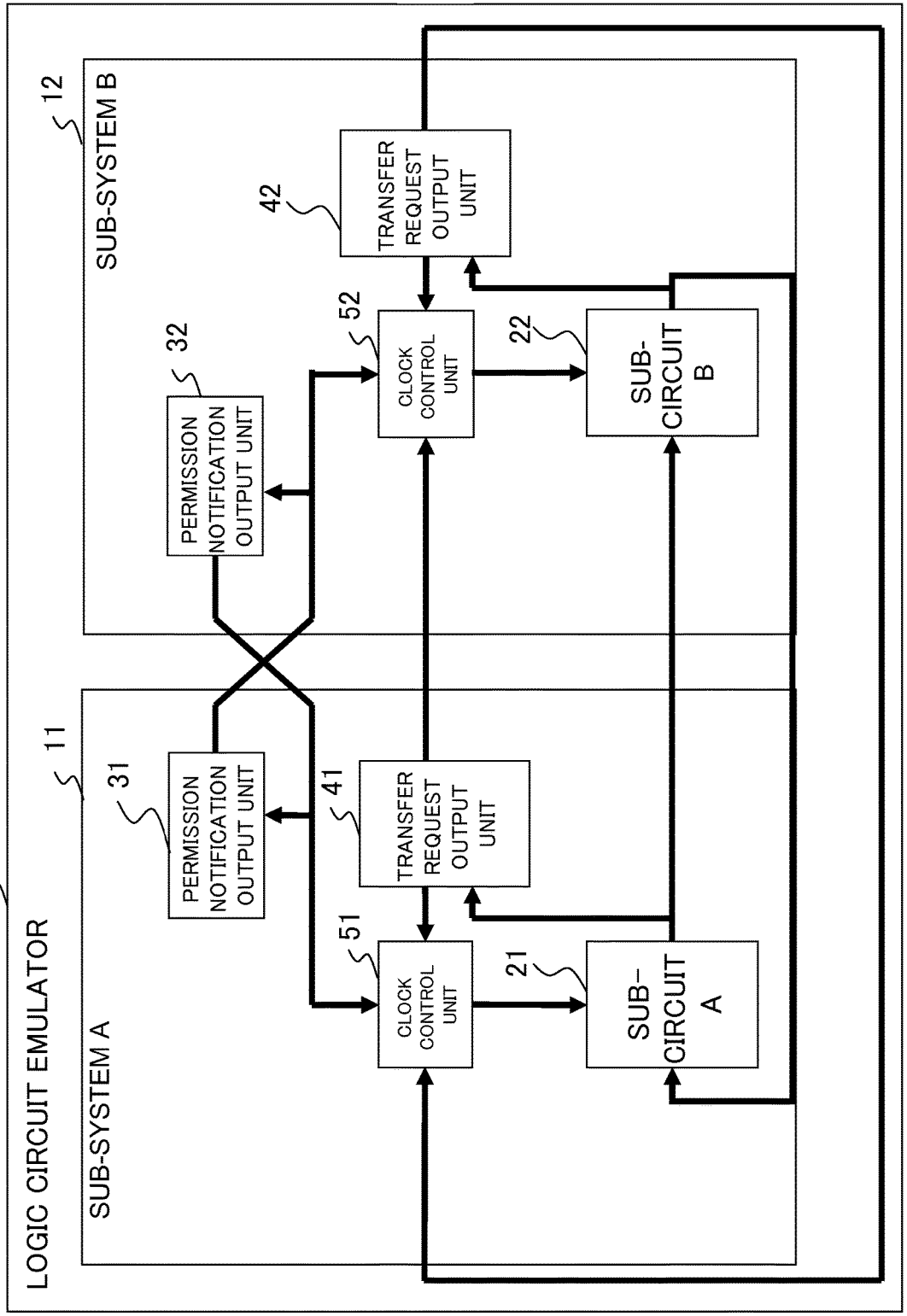
FIG. 1 is a block diagram showing a configuration of a logic circuit emulator according to a first exemplary embodiment.

In the present disclosure, there are various possible modes, which include the following, but not restricted thereto. A logic circuit emulator in a mode 1 may be a logic circuit emulator according to the above mentioned first aspect.

In a logic circuit emulator in a mode 2, in case the clock control unit has output the emulation clock signal, the permission notification output unit may determine that the state of the sub-circuit provided in the own sub-system has advanced.

A logic circuit emulator in a mode 3 may be a logic circuit emulator according to the second aspect.

In a logic circuit emulator in a mode 4, the permission notification output unit and the clock control unit may manage control to tolerate an emulation clock cycle offset between the first and second sub-circuits.

In a logic circuit emulator in a mode 5, the permission notification output unit may output the permission notification depending on whether or not the state of the sub-circuit provided in one of the first and second sub-systems has advanced.

In a logic circuit emulator in a mode 6, the permission notification output unit may determine whether or not the state of the sub-circuit provided in one of the first and second sub-systems has advanced, based on whether or not the clock control unit has output an emulation clock signal.

In a logic circuit emulator in a mode 7, each of the first and second sub-systems may further includes a counter that holds a count value calculated from emulation clock cycle offset between the first and second sub-systems.

In a logic circuit emulator in a mode 8, the counter may hold as the count value a count value that is obtained by adding one to a value equal to the emulation clock cycle offset.

In a mode 9, there is provided a logic circuit emulator in which the permission notification output unit outputs a permission notification in case a count value not less than 1 is stored in the counter.

A method for controlling a logic circuit emulator in a mode 10 may be a method for controlling a logic circuit emulator according to the third aspect.

In the present invention, an emulation clock cycle offset between the different sub-systems is tolerated insofar as integrity of the entire processing is maintained. Hereinafter, a signal controlling the emulation clock is transmitted/received only between the sub-systems whose sub-circuits reciprocally send/receive a signal. That is, according to the present invention, the interconnections for the control signals may be simplified and reduced in length in comparison with a system in which the single control circuit collects the control signals from the total of the sub-systems and controls the emulation clocks of the total of the sub-systems. The speed of the emulation clocks may thus be increased with the logic circuit emulator and the controlling method therefor according to the present invention.

Moreover, according to the present invention, the respective sub-systems independently control emulation clocks. Moreover, according to the present invention, a sub-system (s) in which no change occurs in the input signal and which is permitted by the total of the neighbored sub-systems to progress the emulation clocks can progress the emulation clocks regardless of the presence/absence of the sub-system (s) waiting for signal communication. Thus, in the logic circuit emulator and the controlling method therefor, according to the present invention, the emulation time may be reduced even in case the emulation clock frequency is the same as that of the conventional logic circuit emulator. In case the emulation clock speed is concomitantly increased, the emulation time may be reduced further.

(First Exemplary Embodiment)

A logic circuit emulator according to a first exemplary embodiment will now be described in detail with reference to the drawings.

FIG. 1 depicts a block diagram showing a configuration of a logic circuit emulator 10 according to the present exemplary embodiment. Referring to FIG. 1, the logic circuit emulator 10 includes a plurality of sub-systems in each of which there is provided one of a plurality of sub-circuits obtained on partitioning a verification target circuit. FIG. 1 shows a case where there are two such sub-systems. It should be noted that the number of the sub-systems may not necessarily be two and may be any other suitable plural number.

Referring to FIG. 1, the logic circuit emulator 10 includes a first sub-system (sub-system A11) and a second sub-system (sub-system B12). The first sub-system is provided with a first sub-circuit (sub-circuit A21), while the second sub-system is provided with a second sub-circuit (sub-circuit B22), these sub-circuits being part of the verification target circuit.

The first sub-system (sub-system A11) includes a permission notification output unit 31, a transfer request output unit 41 and a clock control unit 51, while the second sub-system (sub-system B12) includes a permission notification output unit 32, a transfer request output unit 42 and a clock control unit 52.

The permission notification output unit 31 outputs to the other side sub-system a permission notification that permits the other side sub-system to proceed to a next emulation clock cycle, depending on whether or not the state of the sub-circuit (sub-circuit A21) provided in the own [one] sub-system has advanced. Similarly, the permission notification output unit 32 outputs to the other side sub-system a permission notification that permits the other side sub-system to proceed to the next emulation clock cycle, depending on whether or not the state of the sub-circuit (sub-circuit B22) provided in the own [one] sub-system has advanced.

In case a signal that is output from a sub-circuit provided in an own sub-system of the transfer request output unit 41 (sub-circuit A21) and that is to be sent to the sub-circuit of the other side sub-system has changed, the transfer request output unit 41 outputs a request to transfer the signal to the other side sub-system before the next emulation clock cycle. In similar manner, in case a signal that is output from a sub-circuit provided in an own sub-system of the transfer request output unit 42 (sub-circuit B22) and that is to be sent to the sub-circuit of the other side sub-system has changed, the transfer request output unit 42 outputs a request to transfer the signal to the other side sub-system before the next emulation clock cycle.

In case the clock control unit 51 is not transferring a signal from a sub-circuit provided in an own sub-system (sub-circuit A21) to the sub-circuit provided in the other side sub-system, and the clock control unit 51 has received a permission notification but has not received a transfer request from the other side sub-system, the clock control unit 51 controls the emulation clock signal for the sub-circuit provided in the own sub-system to cause the sub-circuit in the own sub-system to proceed to the next emulation clock cycle. In similar manner, in case the clock control unit 52 is not transferring a signal from a sub-circuit provided in an own sub-system (sub-circuit B22) to the sub-circuit provided in the other side sub-system, and the clock control unit 52 has received a permission notification but has not received a transfer request from the other side sub-system, the clock control unit 52 controls the emulation clock signal for the sub-circuit provided in the own sub-system to cause the sub-circuit in the own sub-system to proceed to the next emulation clock cycle.

In the logic circuit emulator 10 of the present exemplary embodiment, emulation clock cycle offset(s) between the different sub-systems may be tolerated insofar as global processing integrity is maintained. By tolerating the emulation clock offset(s), emulation clock controlling signals can be transmitted/received only between the sub-systems whose sub-circuits reciprocally send/receive a signal(s). That is, with the logic circuit emulator 10, interconnections for control signals may be simplified and shorter in length in comparison with a system in which a single control circuit collects control signals from the total of the sub-systems to control the emulation clocks of the total of the sub-systems, for example, the logic circuit emulator 100 shown in FIG. 20. It is thus possible with the logic circuit emulator 10 of the present exemplary embodiment to speed up the emulation clocks.

(Second Exemplary Embodiment)

A logic circuit emulator according to a second exemplary embodiment will now be described in detail with reference to the drawings.

Figure 2:
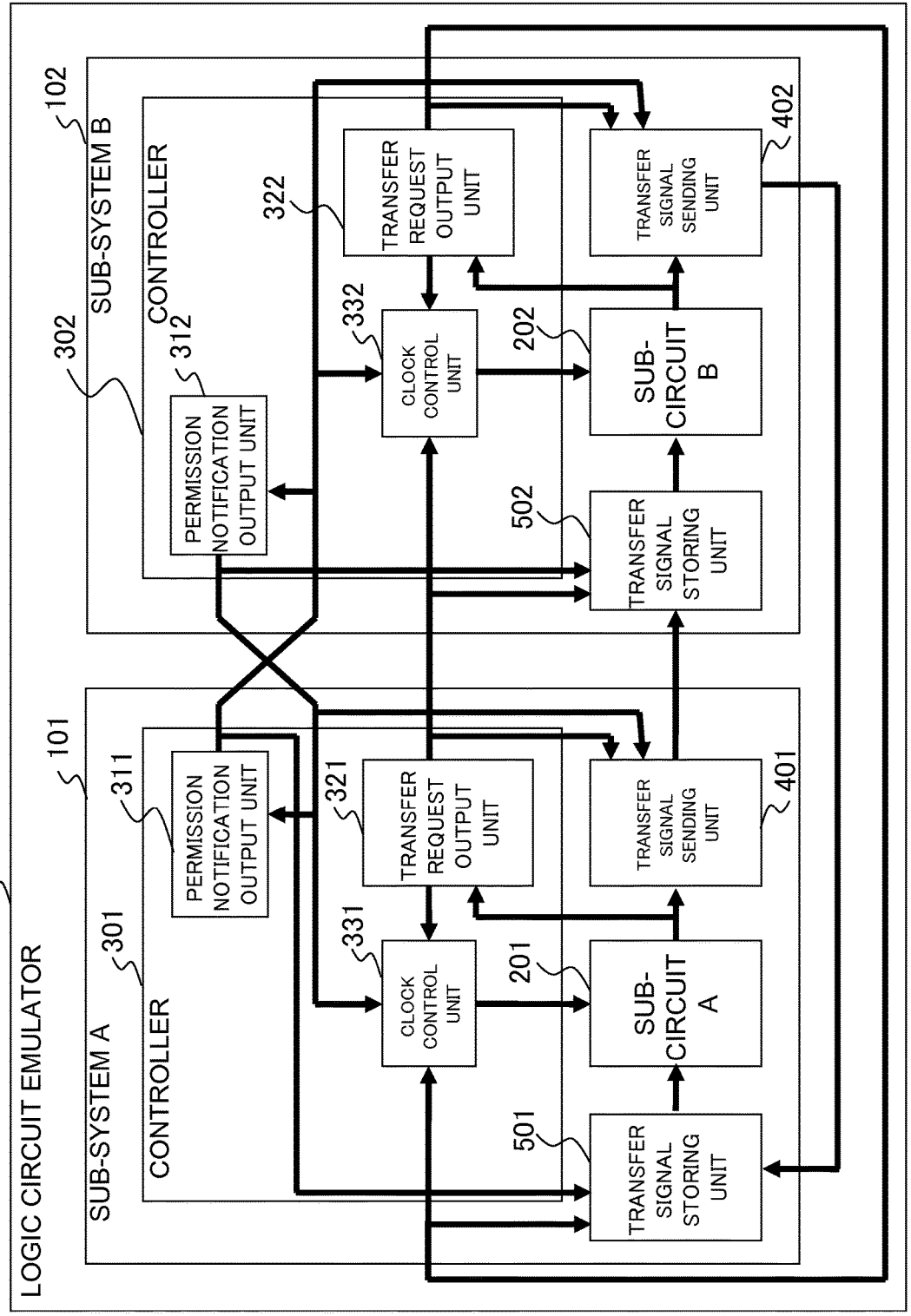
FIG. 2 is a block diagram showing a configuration of a logic circuit emulator according to a second exemplary embodiment.

FIG. 2 depicts a block diagram showing a configuration of a logic circuit emulator 20 according to the present exemplary embodiment. The logic circuit emulator 20 includes two sub-systems A101 and B102. Although the logic circuit emulator 20 including the two sub-systems is here explained, the present invention is not limited to the case having two subsystems and may apply to systems having any suitable plural number of the sub-systems.

Referring to FIG. 2, the logic circuit emulator 20 includes the two sub-systems A101 and B102. The sub-system A101 includes a controller 301, transfer signal storing unit 501, a sub-circuit A201 and a transfer signal sending unit 401. The controller 301 includes a clock control unit 331, a transfer request output unit 321 and a permission notification output unit 311. Similarly, the sub-system B102 includes a controller 302, a transfer signal storing unit 502, a sub-circuit B202 and a transfer signal sending unit 402. The controller 302 includes a clock control unit 332, a transfer request output unit 322 and a permission notification output unit 312.

The sub-circuits A201, B202 are obtained on partitioning the verification target circuit, about to be verified by the designer, and on configuring the resulting partitions on the sub-systems A101, B102, respectively. The verification target circuit may be so partitioned using any suitable commercially available CAD tools or the like.

The controllers 301, 302, respectively, cause partitions of the verification target circuit to be run in operation, by controlling the emulation clocks, as the integrity of the partitions of the verification target circuit is maintained. The emulation clocks are operative to run the sub-circuits A201, B202 in operation.

The transfer signal sending unit 401 receives the transfer signal from the sub-circuit A201, allocated to the sub-system A101, to send a transfer signal to the sub-system B102. The transfer signal, coupled to the sub-circuit B202, allocated to the sub-system B102, is an output signal of the sub-circuit A201, while being an input signal to the sub-circuit B202. Conversely, the transfer signal sending unit 402 transmits the transfer signal from the side the sub-system B102 to the sub-system A101.

The transfer signal storing unit 501 receives a transfer signal from the transfer signal sending unit 402 of the sub-system B102 to hold the received transfer signal as an input to the sub-circuit A201 of the sub-system A101. Conversely, the transfer signal storing unit 502 receives a transfer signal from the transfer signal sending unit 401 of the sub-system A101 to hold the received transfer signal as an input to the sub-circuit B202 of the sub-system B102.

Configurations of the controllers 301, 302 will now be described.

The permission notification output unit 311 sends a permission notification to permit progressing of operation of the sub-circuit A201, while the permission notification output unit 312 sends a permission notification to permit progressing of operation of the sub-circuit B202 to the neighbored sub-system.

It should be noted that the sub-system A neighboring to the sub-system B means such a state in which the output of the sub-circuit A201 of the sub-system A is the input to the sub-circuit B202 of the sub-system B, and/or the output of the sub-circuit B202 of the sub-system B is the input to the sub-circuit A201 of the sub-system A. It is sufficient that at least one of these two conditions is met. Hence, the two neighbored sub-systems are not necessarily physically proximate to each other.

The permission notification is sent from the permission notification output unit 311 of the sub-system A101 to the clock control unit 332 of the sub-system B102, while being also sent from the permission notification output unit 312 of the sub-system B102 to the clock control unit 331 of the sub-system A101. It should be noted that the permission notification output units 311, 312 need not necessarily be enclosed in the sub-systems A101, B102, but may be provided externally. It is however preferred that, if the interconnection length is taken into account, the permission notification output units 311, 312 are respectively enclosed in the sub-systems A101, B102.

The transfer request output units 321, 322 respectively monitor the output signals of the sub-circuits A201, B202 and, in case the output signals have changed, put transfer requests on the respective neighbored sub-systems before the next emulation clock cycle. These transfer requests are sent to the clock control units 331, 332 of the sub-systems A101, B102, respectively.

The clock control units 331, 332 output emulation clocks to cause the states of the sub-circuits A201, B202 to be advanced during the time they have already received permission notifications from the neighbored sub-systems and they are not transmitting/receiving the transfer signals. On the other hand, the clock control units 331, 332 manage control of stopping the emulation clocks during the time they are not receiving the permission notifications or they are transmitting/receiving the transfer signals.

It should be noted that the permission notification output units 311, 312 and the clock control units 331, 332 manage independent emulation clock control of the verification target circuit partitions from one sub-system to another. The operation of the verification target circuit is advanced as the emulation clock cycle offset between the different sub-systems is tolerated insofar as the integrity of the entire system may be maintained.

Figure 20:
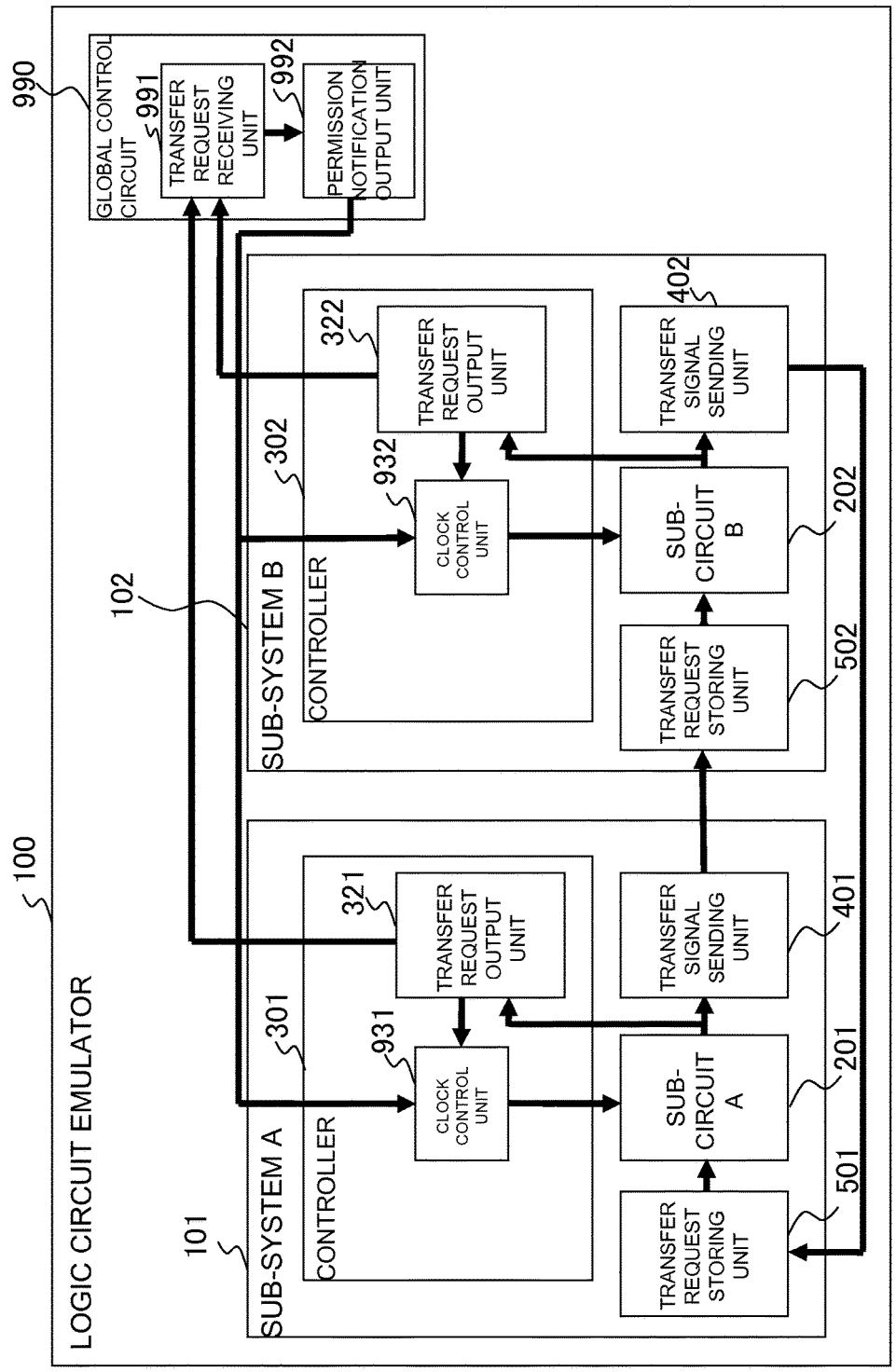
FIG. 20 is a block diagram showing a configuration of a logic circuit emulator in the legacy technique.

On comparison, the logic circuit emulator 20 of the present exemplary embodiment differs from the logic circuit emulator 100 shown in FIG. 20 in not having the global control circuit 990 and in having the permission notification output units 311, 312 by means of which each sub-system may communicate the permission notification to the neighbored sub-system. By such configuration, the logic circuit emulator 20 of the present exemplary embodiment manages control such as to tolerate the emulation clock cycle offsets between the different sub-systems provided that the integrity of the entire system is maintained.

An operation of the logic circuit emulator 20 of the present exemplary embodiment will now be set out with reference to the flowcharts of FIGS. 3 to 7.

Figure 3:
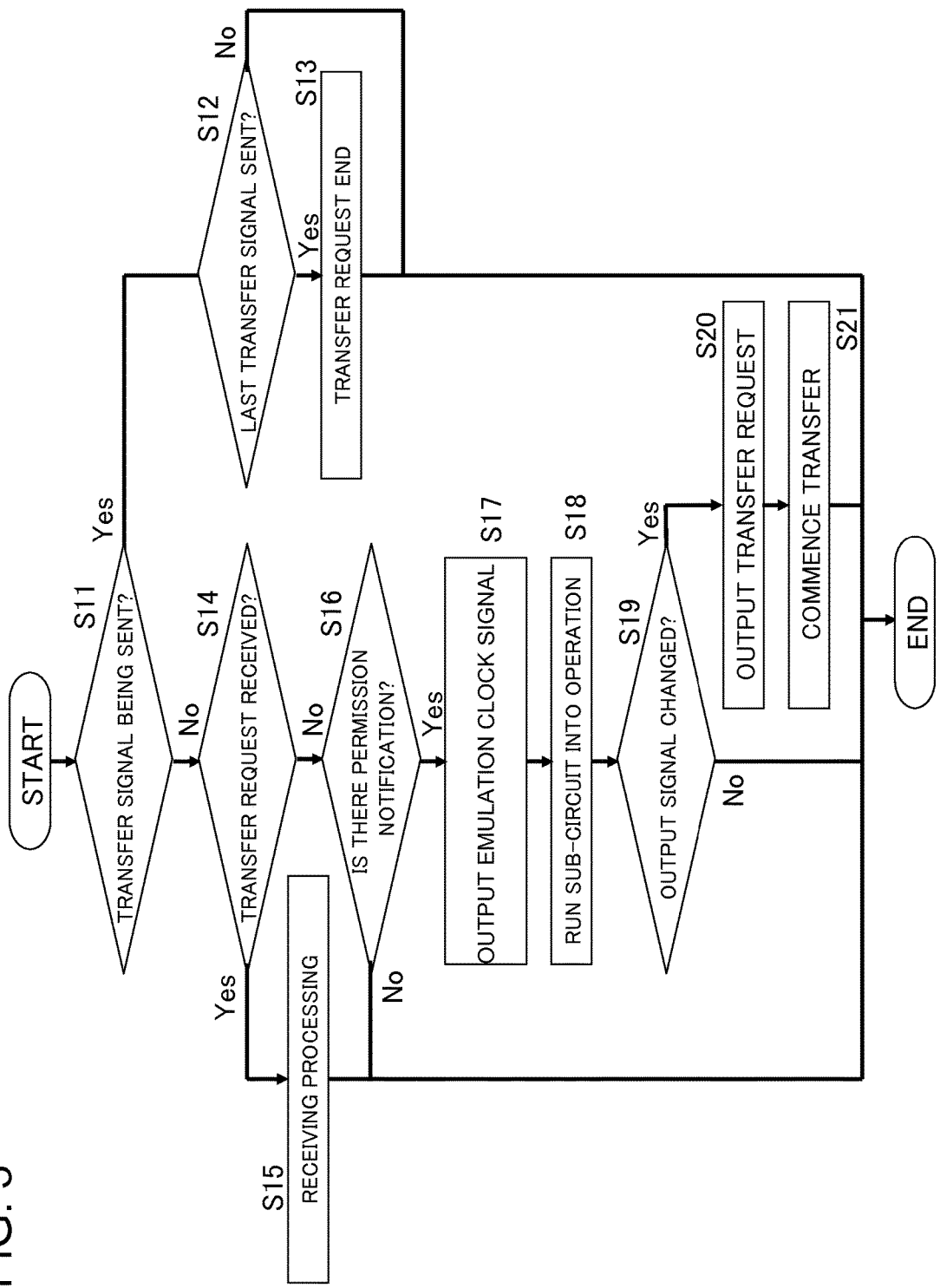
FIG. 3 is a flowchart showing an operation of the logic circuit emulator according to the second exemplary embodiment.

FIG. 3 depicts a flowchart showing an operation of the logic circuit emulator 20 of the present exemplary embodiment. The global operation of the logic circuit emulator 20 of the present exemplary embodiment will now be set out with reference to the flowchart of FIG. 3.

Although the following description focuses on an operation of the sub-system A101, the sub-system B102 also performs a similar operation in parallel.

If the transfer signal sending unit 401 is not transferring a transfer signal (NO of step S11), processing moves to step S14. If the clock control unit 331 is receiving a transfer request from the other sub-system (YES of step S14), the transfer signal storing unit 501 receives the transfer signal (step S15). Since no emulation clock is output, that is, the sub-circuit A201 is not run into operation, the processing comes to a close.

If, on the other hand, no transfer request is received (NO of step S14), processing moves to step S16. If no permission notification is being received (NO of step S16), no emulation clock can be output, and hence the processing comes to a close.

If conversely the permission notification is being received (YES of step S16), the clock control unit 331 outputs an emulation clock (step S17). With the emulation clock being output, the sub-circuit 675 A201 is set into operation (step S18).

After the sub-circuit A201 is set into operation, the transfer request output unit 321 checks to see whether or not the output signal of the sub-circuit A201 has changed (step S19). If there is no change in the output signal (NO of step S19), no transfer signal is transmitted, and hence the processing comes to a close.

If conversely there is any change in the signal (YES of step S19), the transfer request output unit 321 commences to output a transfer request to a sub-system which is a destination of communication of the transfer signal (step S20). The transfer signal sending unit 401 then commences the communication of the transfer signal which is an output signal of the sub-circuit A201 (step S21).

It should be noted that, if the transfer signal sending unit 401 is involved in transferring the transfer signal (YES of step S11), processing moves to step S12. If the last transfer signal has been sent (YES of step S12), the transfer request output unit 321 terminates outputting the transfer request (step S13).

If the transfer signal is not the last one, but there is yet a transfer signal(s) left (NO of step S12), processing comes to a close.

Figure 4:
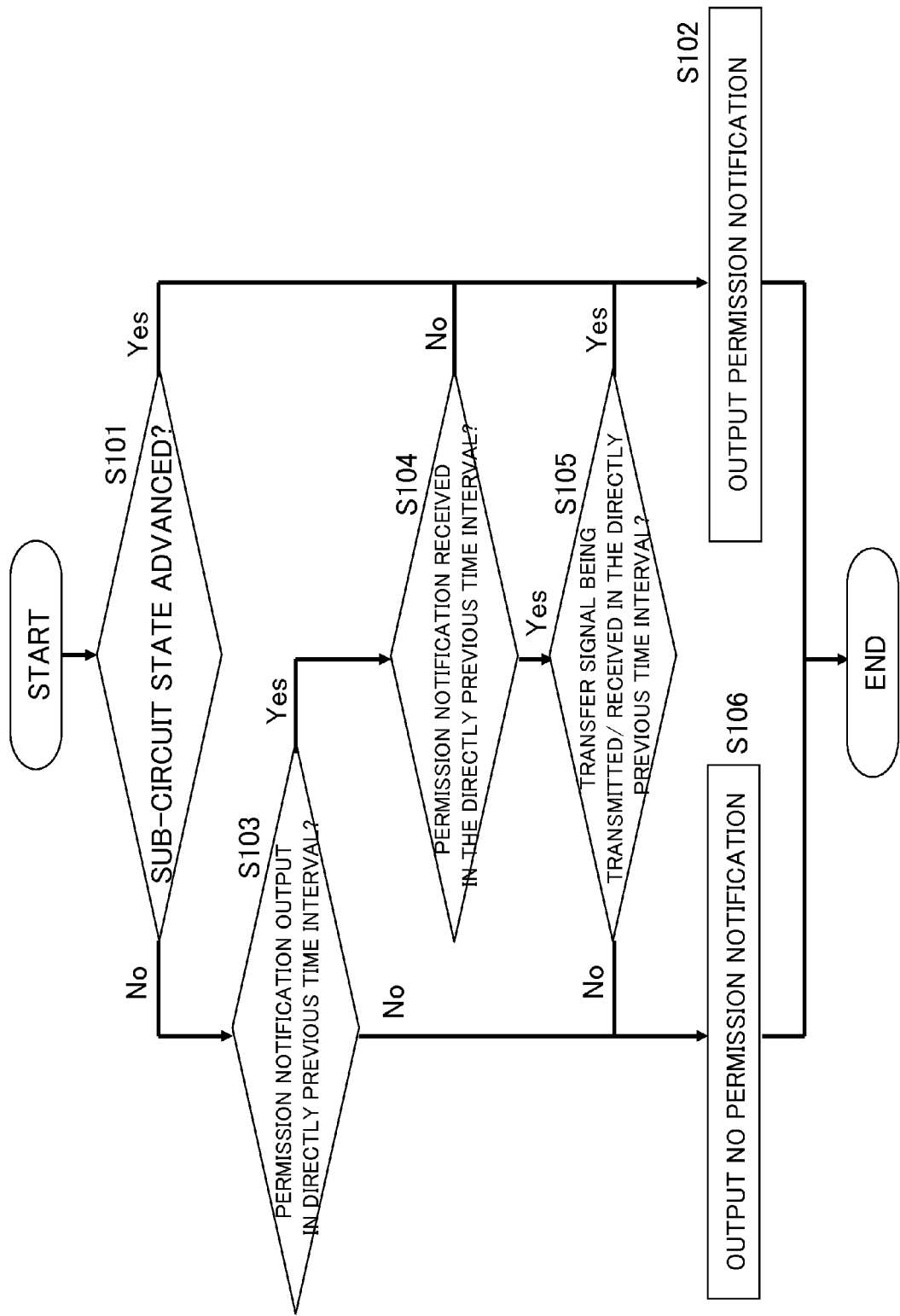
FIG. 4 is a flowchart showing a portion of an operation of a permission notification output unit 311 in the logic circuit emulator according to the second exemplary embodiment.

FIG. 4 depicts a flowchart showing an operation of the 700 permission notification output unit 311 in the logic circuit emulator 20 according to the present exemplary embodiment. Referring to the flowchart of FIG. 4, the operation of the permission notification output unit 311 will now be explained.

Here, an operation in case the sub-system A101 is the transfer signal transmitting side will be explained. The operation here is carried out each time interval corresponding to one emulation clock cycle. In the following description, it is assumed that a time interval is assigned for each clock cycle.

Initially, as time elapses from a directly previous time interval to the current time interval, the permission notification output unit 311 confirms whether or not the state of the sub-circuit A201 has advanced (step S101). This confirmation may be made based on whether or not the clock control unit 331 has output a clock. If the state of the sub-circuit A201 has advanced (YES of step S101), the permission notification output unit 311 outputs a permission notification (step S102).

If conversely the state of the sub-circuit A201 has not advanced (NO of step S101), processing moves to step S103. It is when no permission notification is input or when the transfer signal is being transmitted/received that the state of the verification target circuit is not advanced.

It is then determined whether or not the permission notification output unit 311 output a permission notification in a directly previous time interval (step S103). If the permission notification was not output (NO of step S103), no permission notification is output (step S106).

If conversely the permission notification was output in the directly previous time interval (YES of step S103), processing moves to step S104. It is then concluded whether or not a permission notification was input in the directly (immediately) previous time interval (step S104). If no permission notification was input in the directly previous time interval (NO of step S104), the sub-circuit B202 is not in operation, viz., the permission notification in the directly previous time interval was not received by the sub-system B102. Hence, the permission notification is output in continuation (step S102).

If the permission notification was input in the directly previous time interval (YES of step S104), processing moves to step S105. If the transfer signal was transmitted/received during the directly previous time interval (YES of step S105), the state of the sub-circuit B202 may not be advanced, with the sub-system B102 not receiving the permission notification. Hence, the permission notification is output in continuation (step S102).

If no transfer signal was being transmitted/received in the directly previous time interval (NO of step S105), it is an indication that a permission output in the directly previous time interval was received by the sub-system B102. Hence, no permission notification is output (step S106).

Figure 5:
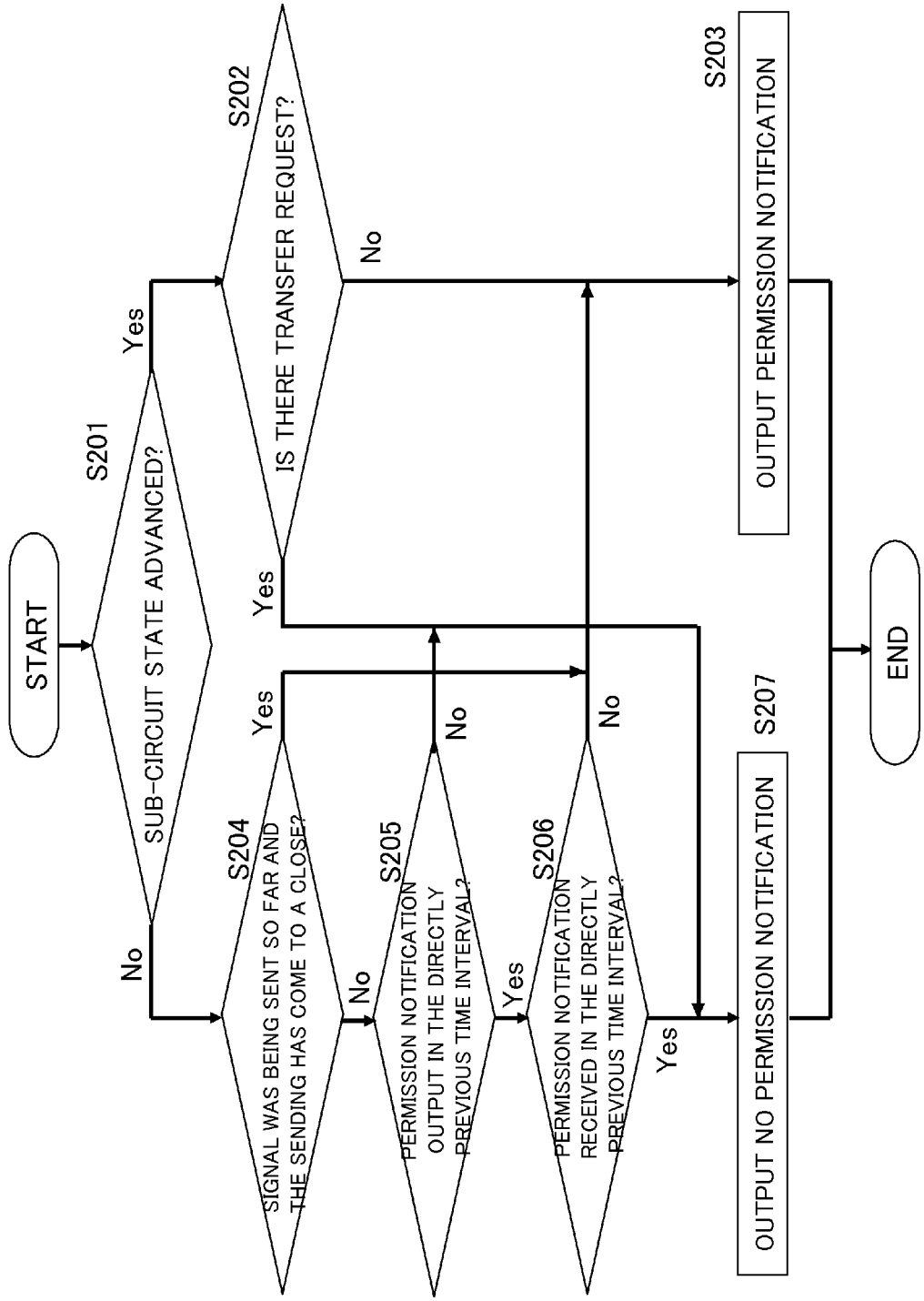
FIG. 5 is a flowchart schematically showing an operation of the permission notification output unit 311 in the logic circuit emulator according to the second exemplary embodiment.

An operation of the permission notification output unit 311 will now be set out with reference to the flowchart of FIG. 5, by way of illustrating an example system different from the flowchart of FIG. 4.

In the system of the flowchart of FIG. 4, the permission notification is made despite the fact that the receiving side sub-system is unable to advance the state of the verification target circuit during transferring the transfer signal. As a matter of global control, if the system shown in the flowchart of FIG. 3 is used, a correct operation is possible without regard to such fact because the verification target circuit is not in operation during transfer even though the permission notification is received. However, to simplify the control of the clock control unit, such a system may be adopted in which the permission notification is made only when it is possible to advance the state of the verification target circuit. The flowchart of FIG. 5 shows this system as an example.

Initially, the permission notification output unit 311 confirms whether or not the state of the sub-circuit A201 has advanced as time elapses from the directly previous time interval to the current time interval (step S201). This confirmation may be made depending on whether or not the clock control unit 331 has output the emulation clock. If the state of the sub-circuit A201 has advanced (YES of step S201), processing moves to step S202.

Then, if no transfer request is being output by the transfer request output unit 321 (NO of step S202), a permission notification is output (step S203).

Conversely, if the transfer request is being output by the transfer request output unit 321 (YES of step S202), no permission notification is output, with the operation of the sub-circuit B202, a communication destination of the transfer signal, being stopped (step S207).

If the state of the sub-circuit A201 has not advanced (NO of step S201), processing moves to step S204. It may be when no permission notification has been input or when the transfer signal is being transmitted/received that the state of the verification target circuit is not advanced. If the verification target circuit has so far been transmitting the transfer signal and the communication has come to a close (YES of step S204), the permission notification is output because the sub-circuit B202, a communication destination of the transfer signal, is able to move to the next state with the transfer signal as an input (step S203).

If otherwise, that is, in case of NO in the step S204, processing moves to step S205. It is then determined whether or not a permission notification was output in the directly previous time interval (step S205). In such case, it may be that no permission notification has been input or that a transfer signal is being sent. However, if the transfer signal is being sent, no permission notification is output. It is thus concluded that no permission notification is being output (NO of step S205), such that no permission notification is output (step S207). In similar manner, no permission notification is output (step S207) if no permission notification is output and no signal transfer is being sent (NO of step S205).

If, on the other hand, no signal is being sent and the permission notification was output in the directly previous time interval (YES of step S205), processing moves to step S206. It is then determined whether or not a permission notification was input in the directly previous time interval (step S206). If the permission notification was input (YES of step S206), it is an indication that the sub-system B102 received the permission output in the directly previous time interval. Hence, no permission notification is output (step S207).

If conversely no permission notification was input in the directly previous time interval (NO of step S206), the output of the permission notification in the directly previous time interval was not received by the sub-system B102. Hence, the permission notification is output in continuation (step S203).

Figure 6:
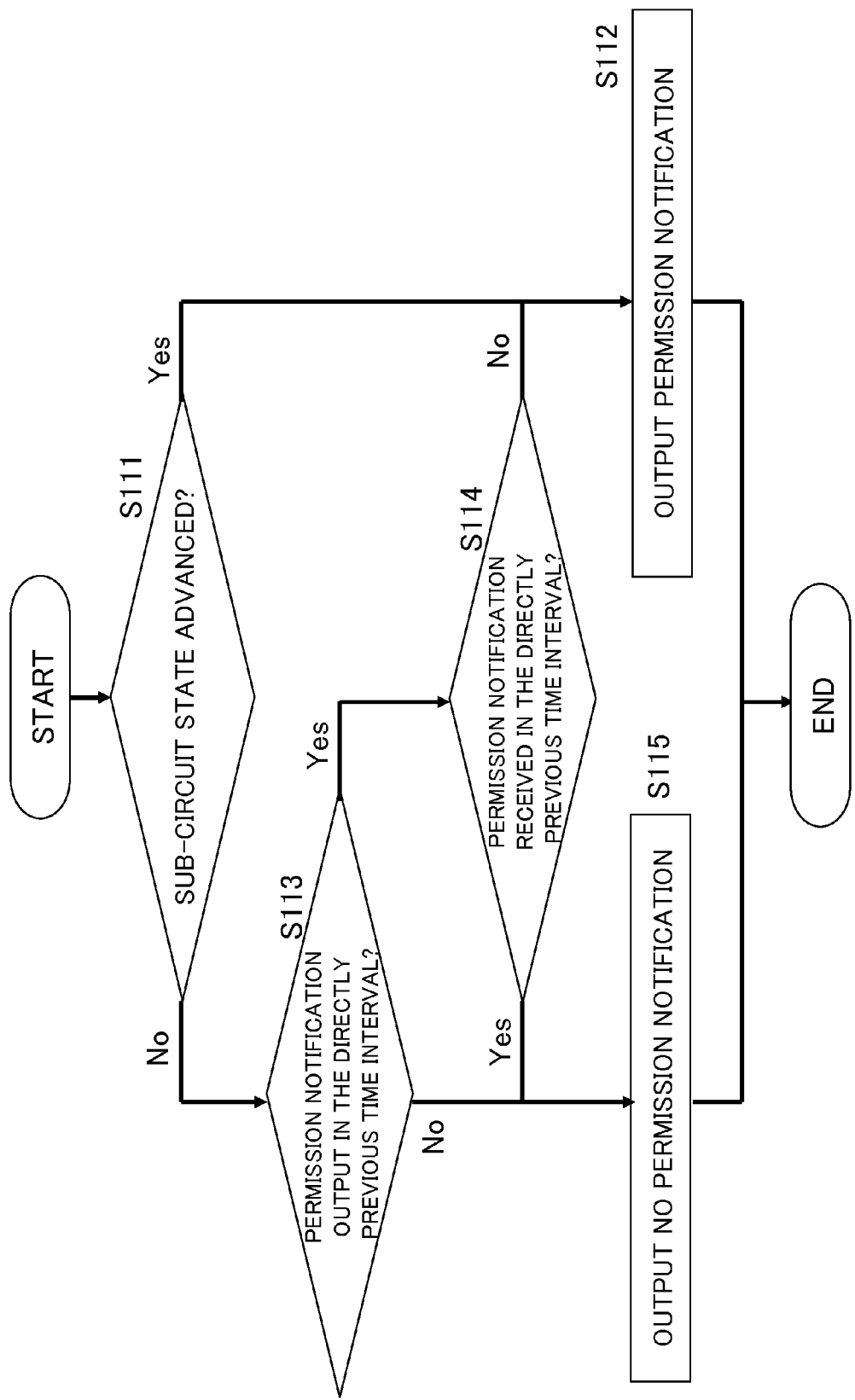
FIG. 6 is a flowchart schematically showing an operation of a permission notification output unit 312 in the logic circuit emulator according to the second exemplary embodiment.

An operation of the permission notification output unit 312 will now be described with reference to the flowchart of FIG. 6.

Here, an operation in case the sub-system B102 is the transfer signal receiving side will be explained. The operation here is carried out in each time interval corresponding to one emulation clock cycle.

Initially, as time elapses from the directly previous time interval to the current time interval, the permission notification output unit 312 confirms whether or not the state of the sub-circuit B202 has advanced (step S111). This confirmation may be made based on whether or not the clock control unit 332 has output a clock. If the state of the sub-circuit B202 has advanced (YES of step S111), the permission notification output unit outputs a permission notification (step S112).

If conversely the state of the sub-circuit B202 has not advanced (NO of step S111), processing moves to step S113. It is when no permission notification is input or when the transfer signal is being transmitted/received that the state of the verification target circuit is not advanced. It is then determined whether or not the permission notification was output in the directly previous time interval (step S113). If the permission notification was not output (NO of step S113), no permission notification is output (step S115).

If conversely the permission notification was output in the directly previous time interval (YES of step S113), it is determined whether or not a permission notification was input in the directly previous time interval (step S114). If the permission notification was input (YES of step S114), it is an indication that the sub-system A101 received the progressing permission output in the directly previous time interval, and hence no permission notification is output (step S115).

If conversely no permission notification was input in the directly previous time interval (NO of step S114), the permission notification output in the directly previous time interval was not received by the sub-system A101. Hence, the permission notification is output in continuation (step S112).

The operation of the permission notification output units 311, 312 has so far been described with the sub-system A101 as the transfer signal sending side and with the sub-system B102 as the transfer signal receiving side. However, in general, the signal may be bidirectionally transmitted/received. In such case, such a method may be used in which both a decision as the sending side and a decision as a receiving side are made and in which, if both the decisions are for outputting the permission notification, the permission notification is actually output.

Figure 7:
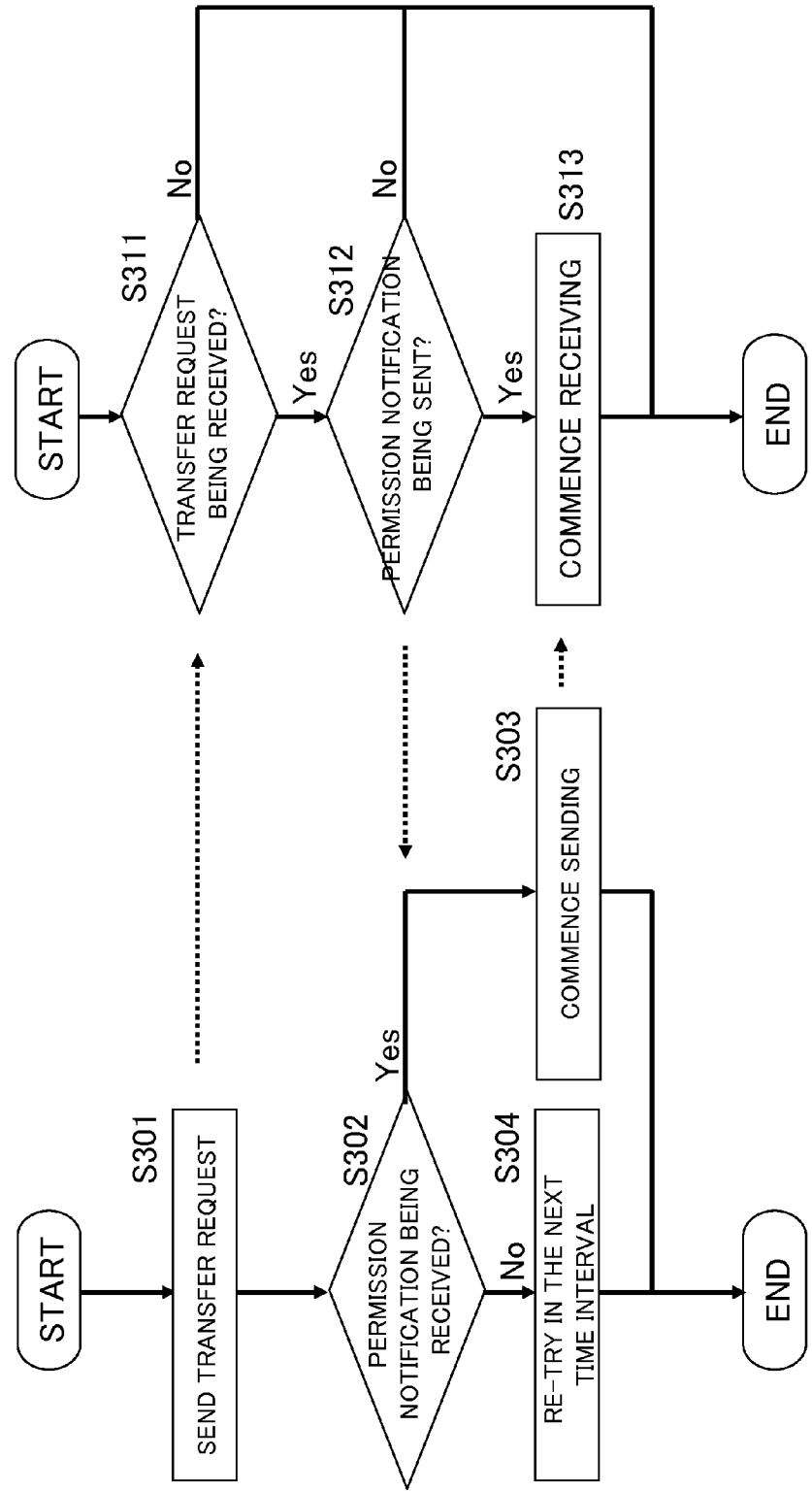
FIG. 7 is a flowchart schematically showing an operation in case transfer is between different sub-systems in the logic circuit emulator according to the second exemplary embodiment.

An operation in which a signal is transferred between different sub-systems will now be described with reference to the flowchart of FIG. 7.

It should be noted that, since the transfer signal sending unit 401 and the transfer signal storing unit 502 are run in concert, these will be discussed here together.

It is assumed here that the sub-system A101 is the transfer signal sending side, with the sub-system B102 being the transfer signal receiving side. The processing here represents the processing within a time interval which is one emulation clock cycle time.

Initially, the processing on the signal transferring side will be set out.

If an output signal of the sub-circuit A201 has changed, the transfer request output unit 321 initially sends a transfer request to the clock control unit 332 and to the transfer signal storing unit 502 (step S301).

The transfer signal sending unit 401 then checks to see whether or not the permission notification has been received from the sub-system of the transfer destination (step S302). If no permission notification has been received (NO of step S302), it is concluded that the sub-system B102 as the transfer destination is in a reception disabled state, and a decision is made on making re-trial in the next time interval (step S304). If the permission notification has been received (YES of step S302), then communication of the transfer signal is commenced (step S303).

The receiving processing to the above described transfer processing will now be set out.

First, the transfer signal storing unit 502 checks to see whether or not a transfer request has been received from the transferring side sub-system A101 (step S311). If no transfer request has been received (NO of step S311), no signal is being transmitted/received. Hence, the processing comes to a close.

If conversely the transfer request has been received (YES of step S311), the transfer signal storing unit 502 checks to see whether or not a permission notification has been output from the sub-system B102 to the sub-system A101 (step S312). If no permission notification has been output (NO of step S312), the sub-system B102 is not in a transfer signal reception enabled state. Hence, processing comes to a close without carrying out the processing of signal reception.

On the other hand, if the permission notification has been output (YES of step S312), the processing for reception is commenced (step S313).

Then, taking an example case of four sub-systems operating in concert, a global operation of the logic circuit emulator 20 according to the present exemplary embodiment will be set out.

It is assumed that the permission notification output unit operates in accordance with the system of the flowchart of FIG. 4. If any of the systems shown in FIG. 4 or 5 is used, the operation remains the same except the state of the permission notification during transmission/reception of the transfer signal.

Figure 8:
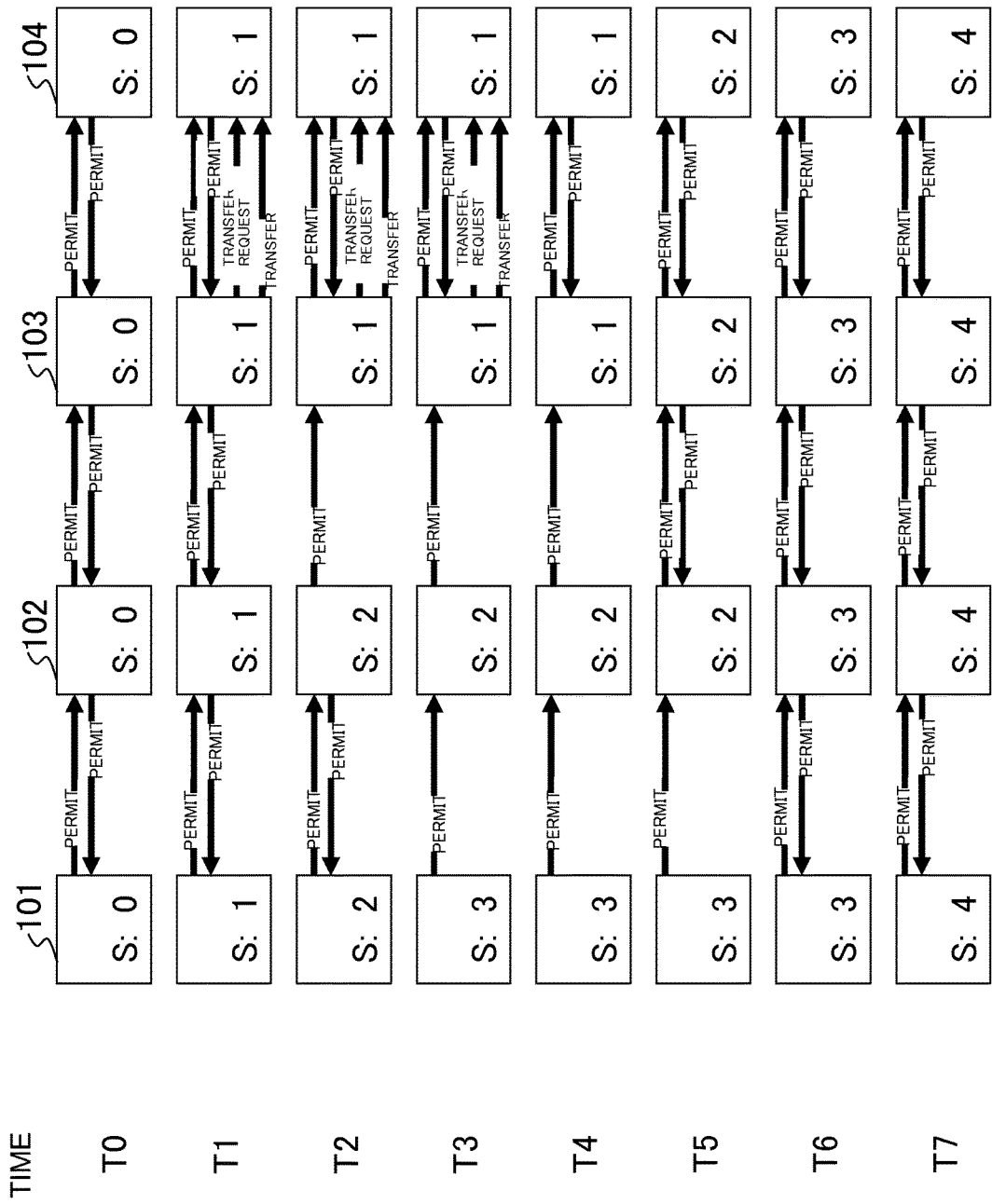
FIG. 8 is a schematic view showing an entire operation in the logic circuit emulator according to the second exemplary embodiment.

In FIG. 8, T0, T1, . . . , T7 on the ordinate represent time intervals each being equal one emulation clock cycle. Each of columns to the right of the time column represents the state of each of the sub-systems 101 to 104.

Entries S:0, S:1, . . . and S:4 within rectangle symbols of the sub-systems represent a non-advanced state, a 1-cycle advanced state . . . and a four-cycle advanced state of the emulation clock cycles of a sub-system of interest, respectively.

In general, the transfer signals are bi-directional and are connected to a plurality of sub-systems. However, for simplicity of the explanation, it is here assumed that the signal is uni-directionally sent from the sub-system 101 on the left side to the sub-system 104 on the right side in FIG. 8.

Such a case is here shown in which an output signal of the sub-system 101 in the state S:1, an input signal to the sub-system 102, has changed, and in which communication of a transfer signal to the sub-system 102 in need of transferring time of three emulation clock cycles is to be made.

Referring to FIG. 8, no transfer signal is transmitted/received in time interval T0, and hence each sub-system advances to the state S:1 in time interval T1.

In time interval T1, it becomes necessary to send the transfer signal from the sub-system 101, which is now in the state S:1, to the sub-system 102. Thus, the sub-system 101 commences outputting a transfer request to the sub-system 102 at the same time as it commences signal communication. The sub-system 102 is receiving the transfer request from the sub-system 101 and hence its state is not advanced as time elapses to the time interval T2. Since no transfer request is made for the sub-systems 102 to 104, permission notifications are output through from these sub-systems. Hence, the states of the sub-systems 102 to 104 are advanced to the state S:2 as time elapses to the time interval T2.

In time interval T2, the sub-systems 101, 102 remain in the state S:1, while the sub-systems 103, 104 are advanced to the state S:2. That is, if the logic circuit emulator 20 is looked upon in its entirety, the systems with different advanced states are allowed to co-exist.

Attention is now focused on the sub-systems 102 and 103 which now undergo a state differential. It is apparent that no transfer signal is transmitted/received in time interval T1 between the sub-systems 102 and 103, that is, the input signal to the sub-system 103 is unchanged. It is thus seen that, if the state of the sub-system 102 is not advanced as time elapses to time T2, but the state of the sub-system 103 is advanced for the time being and the state of the sub-system 102 is subsequently equated to that of the sub-system 103, integrity may not be compromised. In the logic circuit emulator 20 of the present exemplary embodiment, a state offset from one sub-system to another, that is, an emulation clock cycle offset, may be tolerated in this manner as global system integrity is maintained.

In time interval T2, signals continue to be transmitted/received between the sub-systems 101 and 102. The states of the sub-systems 101 and 102 are not advanced as time elapses to time T3. On the other hand, the permission notification between the sub-systems 101 and 102 keeps on being output in accordance with the flowcharts of FIGS. 4 and 6. It is because the sub-systems 101, 102 are involved in transmitting/receiving the signal as from the time the permission notification was made, that is, the states of the sub-systems 101, 102 may not be advanced. At this time, the sub-systems 103, 104 keep on outputting permission notifications. However, since no permission notification is output from the sub-system 102 to the sub-system 103, the state of the sub-system 103 is not advanced as time elapses to the time T3. On the other hand, the sub-system 104 is advanced to the state S:3.

In time interval T3, transmission/reception is continued between the sub-systems 101 and 102, because the outstanding signal transfer is in need of time corresponding to three emulation clocks. The states of the sub-systems 101, 102 are not advanced as time elapses to time interval T4. Since the state has not advanced this time, the sub-system 103 outputs no permission notification to the sub-system 104. On the other hand, the state of the sub-system 102 is not advanced since the time the permission notification was output. That is, the sub-system 102 outputs no permission notification to the sub-system 103 and the permission notification from the sub-system 103 has not been received by the sub-system 102. Hence, the permission notification from the sub-system 103 to the sub-system 102 keeps on being output in accordance with the flowchart of FIG. 6. The sub-system 104 outputs the permission notification as before. At this time, no permission notification is output from the sub-system 103 to the sub-system 104. Hence, the state of the sub-system 104 is not advanced as time elapses to the time interval T4.

At time interval T4, the transmission/reception of the transfer signal comes to a close, and hence the sub-system 101 stops the transfer request to the sub-system 102. Hence, the sub-systems 101, 102 advance to the state of S:2 as time elapses to time interval T5. On the other hand, the states of the sub-systems 103, 104 are not advanced.

In the time interval T5, the sub-system 101, 102 output permission notifications. Hence, the sub-systems 101 to 103 advance to the state S:3 as time elapses to time interval T6.

At time intervals T6, T7, the output signals of the verification target circuit partitions on the respective sub-systems are not changed. Hence, the sub-systems reciprocally output permission notifications and advance to the state S:3 and thence to the state S:4, in conformity to the progressing of the emulation clocks, as time elapses to the next following time intervals.

Such a case is now considered in which, in the logic circuit emulator 100 shown in FIG. 20, an output signal of the sub-system 101 in the state of S:1, an input signal to the sub-system 102, has changed in similar manner, such that there has occurred communication of the transfer signal to the sub-system 102, which communication is in need of transferring time corresponding to three emulation clock cycles.

Figure 21:
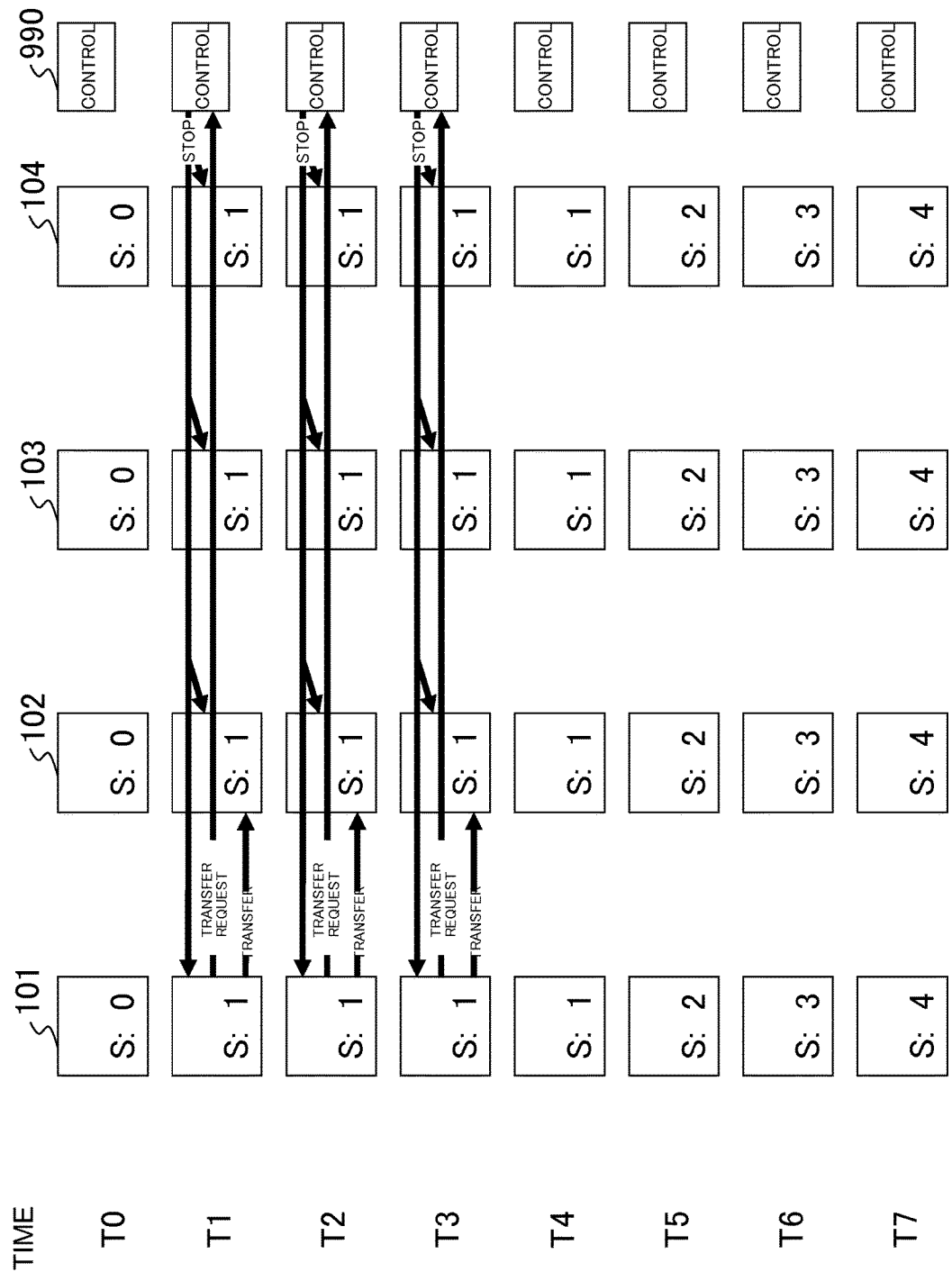
FIG. 21 is a schematic view showing an operation of the logic circuit emulator in the legacy technique.

In FIG. 21, the transfer signal is not transmitted/received in time interval T0, and hence the respective sub-systems advance to the states S:1 in time interval T1.

Then, in time interval T1, it becomes necessary for the sub-system 101, which is now in the state S:1, to send a transfer signal to the sub-system 102. Hence, the sub-system 101 sends a transfer request to the global control circuit 990, which global control circuit 990 then stops outputting permissions notifications to the total of the sub-systems 101 to 104, that is, sends a command to stop the emulation clocks. The respective sub-systems, which thus cease to receive the permission notifications, stop the emulation clocks until receiving the permission notifications. In keeping with the cessation of the operations of the verification target circuit partitions on the logic circuit emulator 100, caused by the cessation of the emulation clocks, a transfer signal commences to be sent from the sub-system 101 to the sub-system 102.

Signal transmission/reception is continued through during time intervals T2, T3 because the outstanding communication is in need of time corresponding to three emulation clocks.

At time interval T4, transfer signal transmission/reception comes to a close, and hence the sub-system 101 ceases to put the transfer request on the global control circuit 990. The global control circuit 990 then outputs permission notifications to the total of the sub-systems 101 to 104, that is, ceases to issue an emulation clock stop command. Hence, the sub-systems re-commence outputting the emulation clocks and advance to the state S:2 as time elapses to time interval T5.

Subsequently, during the time intervals T5 to T7, the states of the output signals of the verification target circuit partitions on the respective sub-systems are unchanged. Thus, the respective sub-systems proceed to the state S:3 and thence to the state S:4, in conformity to the progress of the emulation clocks, as time elapses to the next time intervals.

FIGS. 8 and 21 are now compared to each other. In the logic circuit emulator 20 of the present exemplary embodiment, in case the transfer signal is transmitted/received between the sub-systems 101 and 102, the states of these sub-systems 101 and 102 are not advanced. However, the states of the sub-systems 103 and 104, which do not affect the global system integrity in the corresponding time intervals, are advanced to the next states for the time being. Ultimately, the states of the total of the sub-systems are advanced as in the legacy logic circuit emulator 100. It is thus possible to maintain the global integrity of the verification target circuit partitions.

Figure 9:
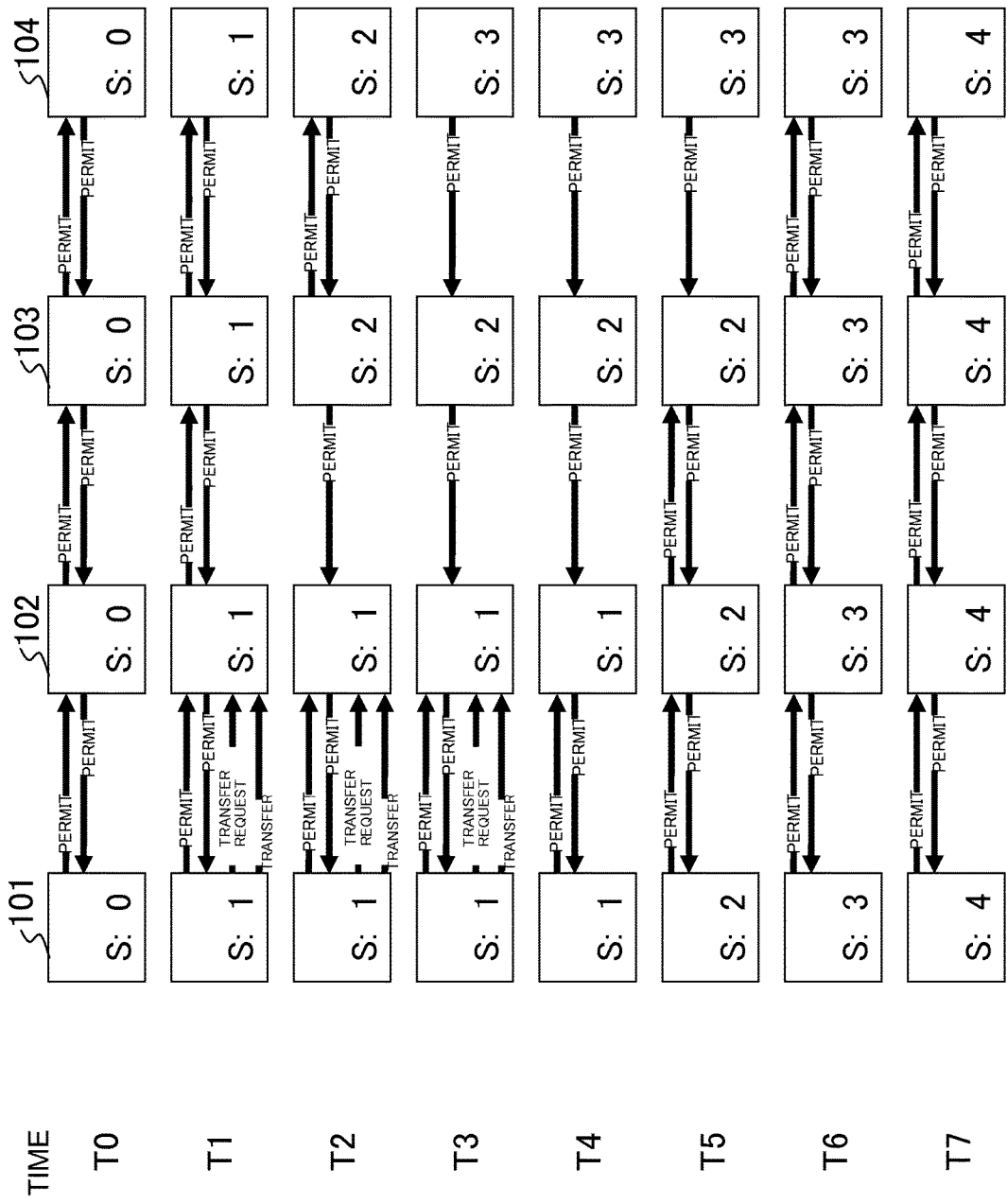
FIG. 9 is also a schematic view showing an entire operation in the logic circuit emulator according to the second exemplary embodiment.

FIG. 9 shows such a case where an output signal of the verification target circuit partition on the sub-system 103 in the state S:1, an input signal to the verification target circuit partition on the sub-system 104, has changed, such that communication of a transfer signal occurs. This communication is in need of communication time corresponding to three emulation clock cycles for the sub-system 104.

Referring to FIG. 9, no transfer signal is transmitted/received in time interval T0. Hence, the respective sub-systems advance to a state S:1 in time interval T1.

Next, in time interval T1, it becomes necessary to send the transfer signal from the sub-system 103, now set to the state S:1, to the sub-system 104. Hence, the sub-system 103 outputs a transfer request to the sub-system 104, while commencing to transmit the transfer signal. Since the signal transfer request has been put on the sub-system 104 from the sub-system 103, the state of the sub-system 104 is not advanced as time elapses to time interval T2. Since no transfer request is made at this time between the sub-systems 101 and 102 or between the sub-systems 102 and 103, the sub-systems 101, 102 advance to the state S:2 as time elapses to T2.

In the time interval T2, transmission/reception is continued between the sub-systems 103 and 104. The states of the sub-systems 103, 104 are not advanced as time elapses to time interval T3. Since the time the permission notification was made, the sub-systems 103 and 104 are involved in transmission/reception, that is, the states of the sub-systems 103 and 104 may not be advanced. Hence, the permission notification between the sub-systems 103 and 104 keeps on being output in accordance with the flowcharts of FIGS. 4 and 6. At this time, the sub-systems 101, 102 keep on outputting permission notifications. However, no permission notification is output from the sub-system 103 to the sub-system 102. Hence, the state of the sub-system 102 is not advanced as time elapses to the time interval T3. On the other hand, the state of the sub-system 101 is advanced to the state S:3.

Since the transmission/reception is in need of time corresponding to three emulation clocks, transmission/reception is continued between the sub-systems 103 and 104 during the time interval T3. The states of sub-systems 103, 104 are not advanced as time elapses to time interval T4. Since the state of the sub-system 102 has not advanced this time, no permission notification is output from the sub-system 102 to the sub-system 101. On the other hand, the state of the sub-system 103 has not advanced since the time the permission notification was made. That is, the sub-system 103 delivers no permission notification to the sub-system 102, while no permission notification from the sub-system 102 has been received by the sub-system 103. Hence, the permission notification from the sub-system 102 to the sub-system 103 keeps on being output in accordance with the flowchart of FIG. 4. The sub-system 101 keeps on outputting the permission notification. Since no permission notification is delivered at this time from the sub-system 102 to the sub-system 101, the state of the sub-system 101 is not advanced as time elapses to the time interval T4.

The transfer signal ceases to be transmitted/received as time elapses to T4. Hence, the sub-system 103 ceases to put a transfer request on the sub-system 104. Thus, the sub-systems 103, 104 are advanced to the state S:2 as time elapses to time interval T5. The states of the sub-systems 101, 102 are not advanced.

In time interval T5, the sub-systems 103, 104 output permission notifications. Hence, the sub-systems 102 to 104 are advanced to the state S:3 as time elapses to T6.

In the time intervals T6, T7, the output signals of the verification target circuit partitions on the sub-systems are unchanged. Hence, the permission notifications are output reciprocally. The respective sub-systems are advanced to state S:3 and thence to state S:4, in keeping with the progressing of the emulation clocks, as time elapses to the next time intervals.

If similar signal transfer occurs in the logic circuit emulator 100, shown in FIG. 20, the operation of the logic circuit emulator 100 ceases in its entirety. Thus, in the operation that should take place corresponds to the operation of FIG. 21 in which the transfer signal transmitting/receiving sites are changed to from the sub-system 103 to the sub-system 104.

Figure 10:
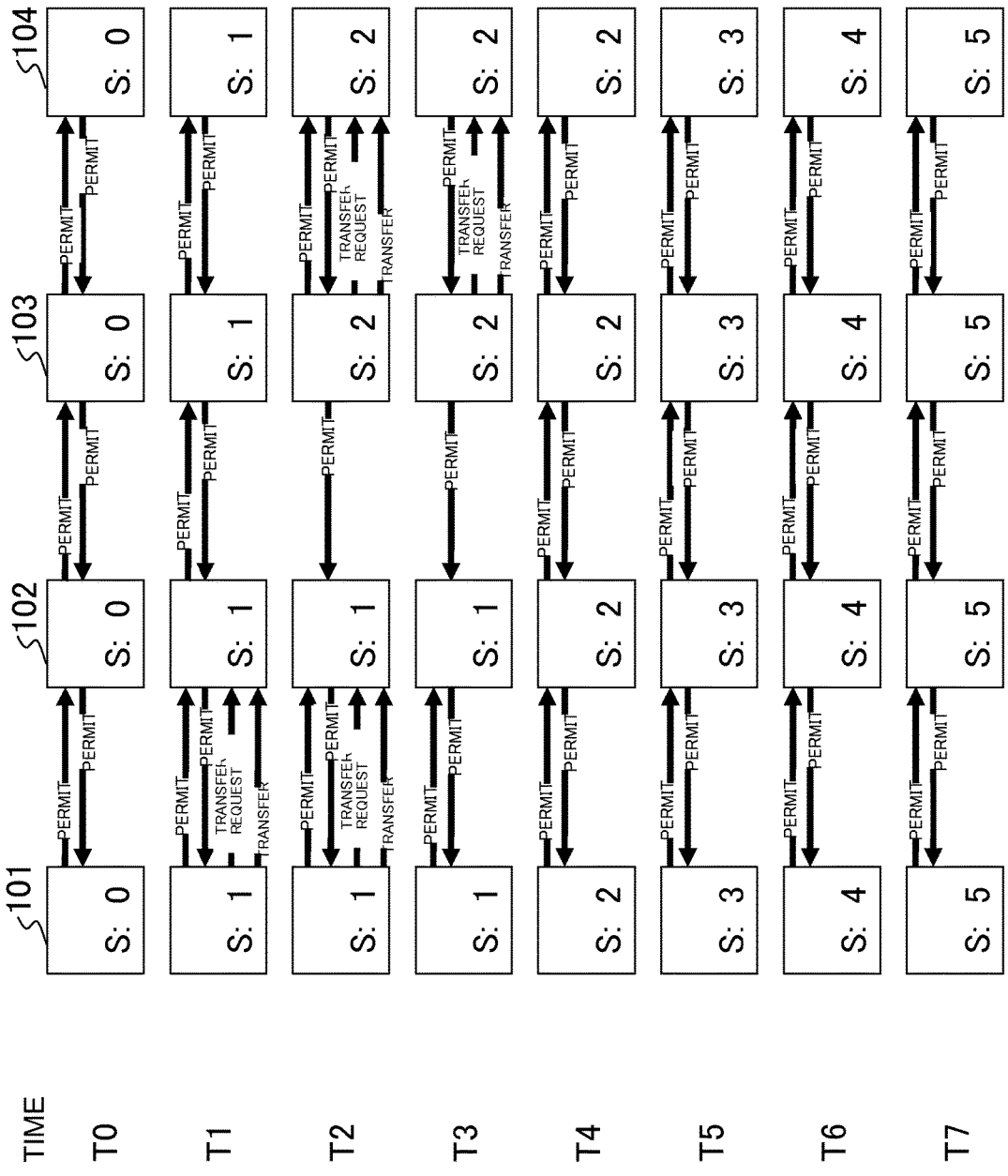
FIG. 10 is similarly a schematic view showing an entire operation in the logic circuit emulator according to the second exemplary embodiment.

In a case shown in FIG. 10, an output signal of the verification target circuit partition on the sub-system 101 in the state S:1, an input signal to the verification target circuit partition on the sub-system 102, has changed such that there occurs transmission/reception of the transfer signal in need of transfer time of two emulation clock cycles for the sub-system 102. In this case, an output signal of the verification target circuit partition on the sub-system 103 in the state S:2, an input signal to the verification target circuit partition on the sub-system 104, has also changed such that there also occurs communication of the transfer signal which is in need of transfer time of two emulation clock cycles for the sub-system 104.

Initially, no signal transmission/reception occurs in time interval T0. Hence, the respective sub-systems advance to the state of S:1 in the time interval T1.

Then, in the time interval T1, it becomes necessity for the sub-system 101, now set to the state of S:1, to transfer a signal to the sub-system 102. The sub-system 101 thus outputs a transfer request to the sub-system 102, while commencing to transfer the signal. Since the transfer request is put on the sub-system 102 from the sub-system 101, the state of the sub-system 102 is not advanced as time elapses to the time interval T2. Since no transfer request is made between the sub-systems 102 and 104, the sub-systems 103, 104 are advanced to the state S:2 as time elapses to the time interval T2.

Since the outstanding signal transmission/reception is in need of time corresponding to two emulation clocks, signal transmission/reception is continued in the time interval T2 between the sub-systems 101 and 102. On the other hand, the states of the sub-systems 101, 102 are not advanced as time elapses to the time interval T3. Moreover, as from the time the permission notification was made, signal transmission/reception is going on between the sub-systems 101, 102, that is, the states of the sub-systems 101, 102 may not be advanced. Hence, the permission notification between the sub-systems 101, 102 keeps on being output in accordance with the flowcharts of FIGS. 4 and 6. At this time, it becomes necessary for the sub-systems 103, now set to the state S:2, to send a transfer signal to the sub-system 104. The sub-system 103 thus outputs a transfer request to the sub-system 104, while commencing signal transfer. Since a transfer request is put from the sub-system 104 on the sub-systems 103, the state of the sub-system 104 is not advanced as time elapses to the time interval T3.

The transfer signal transmission/reception from the sub-system 101 comes to a close as time elapses to the time interval T3. Hence, the sub-system 101 stops putting the transfer request on the sub-system 102. The states of the sub-systems 101, 102 are advanced to the state S:2 as time elapses to the time interval T4. On the other hand, signal transmission/reception is continued between the sub-systems 103, 104. The states of the sub-systems 103, 104 are not advanced as time elapses to the time interval T4. Also, since the time the permission notification was made, the signal transmission/reception is going on between the sub-systems 103, 104, that is, the states of the sub-systems 103, 104 may not be advanced. Hence, the permission notification between the sub-systems 103, 104 keeps on being output in accordance with the flowcharts of FIGS. 4 and 6.

In the time interval T4, the states of the sub-systems 101, 102 have been advanced to S:2. Hence, the sub-system S2 outputs a permission notification to the sub-system 103. On the other hand, the transmission/reception of the transfer signal from the sub-system 103 to the sub-system 104 comes to a close, so that the sub-system 103 stops putting the transfer request on the sub-system 104. Hence, the sub-systems 103, 104 are advanced to the state S:3 as time elapses to the time interval T5.

Then, in the time intervals T5 to T7, the output signals of the verification target circuit partitions on the respective sub-systems are unchanged. Thus, the sub-systems reciprocally output the permission notifications. The respective sub-systems are advanced to the state S:4 and thence to the state S:5, in keeping with the progressing of the emulation clock, as time elapses to the next time intervals.

Figure 22:
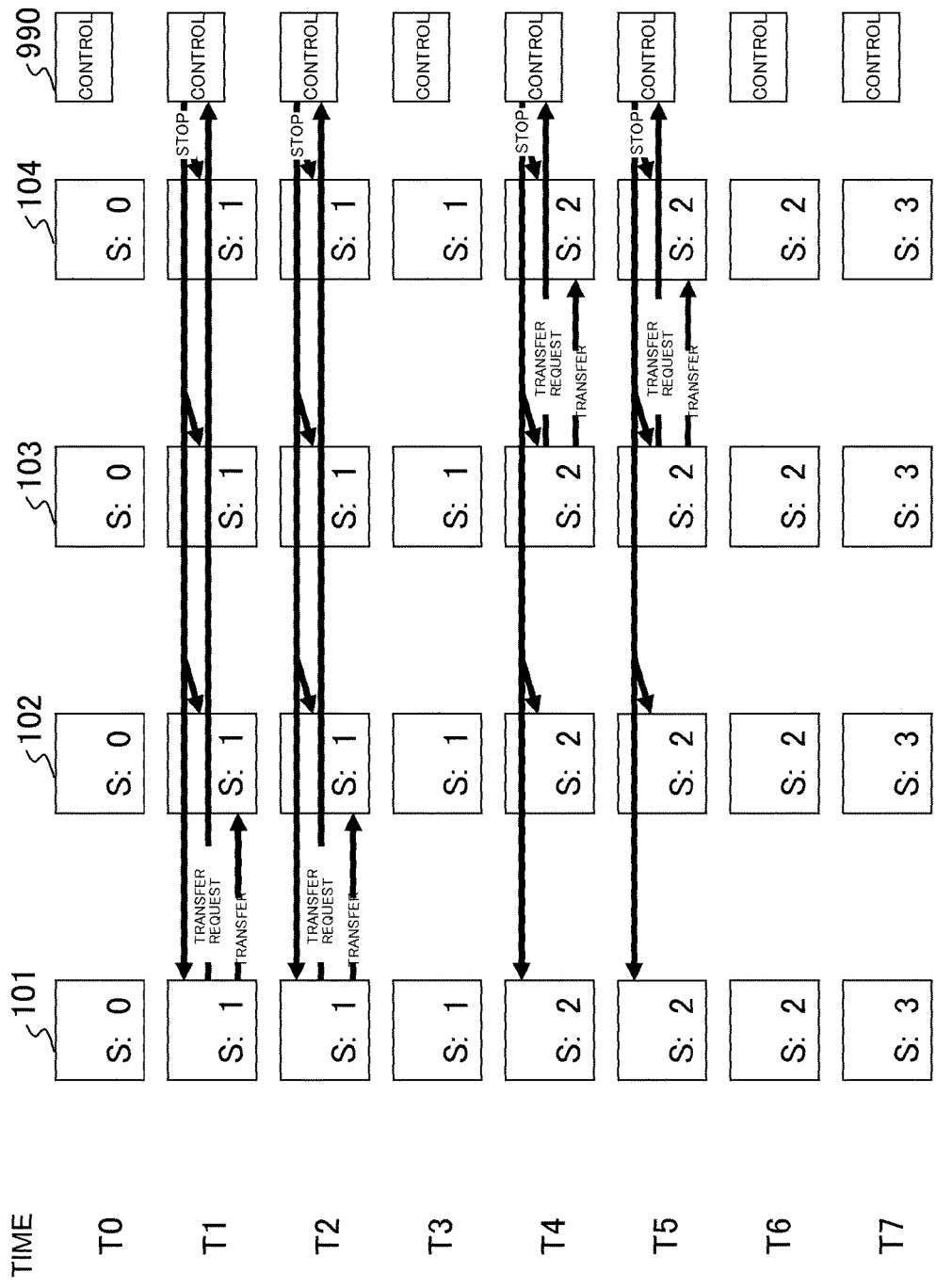
FIG. 22 is similarly a schematic view showing an operation of the logic circuit emulator in the legacy technique.

In a case shown in FIG. 22, an output signal of the verification target circuit partition on the sub-system 101 in the state S:1, an input signal to the verification target circuit partition on the sub-system 102, has changed. Hence, there occurs transmission/reception of the transfer signal which is in need of transfer time of two emulation clock cycles for the sub-system 102. In this case, an output signal of the verification target circuit partition on the sub-system 103 in the state S:2, an input signal to the verification target circuit partition on the sub-system 104, has also changed. Hence, there also occurs transmission/reception of the transfer signal which is in need of transfer time of two emulation clock cycles for the sub-system 104.

Referring to FIG. 22, no transmission/reception of the transfer signal occurs in the time interval T0, so that the respective sub-systems are advanced to the state S:1 in the time interval T1.

In the time interval T1, it becomes necessary for the sub-system 101, now set to the state S:1, to transmit the transfer signal to the sub-system 102. The sub-system 101 outputs a transfer request to the global control circuit 990, which global control circuit 990 then stops outputting the permission notifications to the total of the sub-systems 101 to 104, that is, sends an emulation clock stop command. The respective sub-systems, which ceased receiving the permission notifications, stop emulation clocks until receiving the permission notifications. In this manner, at the same time as the operation of the verification target circuit partitions on the logic circuit emulator 100 ceases by the cessation of the emulation clocks, transfer signal transmission/reception from the sub-system 101 to the sub-system 102 is commenced.

The outstanding transfer is in need of time corresponding to two emulation clocks. Hence, the transmission/reception is continued through in the time interval T2.

In the time interval T3, the transfer signal transmission/reception comes to a close. Hence, the sub-system 101 stops putting transfer requests on the global control circuit 990, which global control circuit 990 then outputs the permission notifications to the total of the sub-systems 101 to 104. That is, the emulation clock stop command is terminated. Hence, the respective sub-systems re-initiate outputting the emulation clocks. The respective sub-systems advance to the state S:2 as time elapses to the time interval T4.

In the time interval T4, the respective sub-systems are in the state S:2. It is thus necessary for the sub-system 103 to send a transfer signal to the sub-system 104. Similarly, a transfer signal commences to be transmitted from the sub-system 103 to the sub-system 104, at the same time as the sub-system 103 outputs a transfer request to the global control circuit 990, with the operations of the respective sub-systems then coming to a close.

In the time interval T5, signal transfer is carried out in continuation. In the time interval T6, the transfer request is canceled. Thus, in the time interval T7, the respective systems advance to the state S:3.

In the logic circuit emulator 100, shown in FIG. 22, the state is S:3 in the time interval T7, meaning that the state is advanced just by three emulation clocks. In the logic circuit emulator 20 of the present exemplary embodiment, shown in FIG. 10, the state is S:5 in the time interval T7, meaning that the state is advanced by five emulation clocks.

In the logic circuit emulator 100, the operation of the entire system ceases during transfer between certain different sub-systems. However, in the logic circuit emulator 20 of the present exemplary embodiment, the sub-systems 103, 104 may be advanced to forward side states during the time the states of the sub-systems 101 and 102 are stopped. It is thus possible to commence the transmission/reception of the transfer signal between the sub-systems 103, 104 during the time of transmission/reception of the transfer signal between the sub-systems 101, 102. Thus, in the logic circuit emulator 20 of the present exemplary embodiment, it is possible to advance the states faster in terms of the number of the emulation clocks than in the logic circuit emulator 100.

In the present exemplary embodiment, explanation of transfer clocks for transfer from one sub-system to another is omitted for simplicity. However, to reduce the transfer time, a transfer system which uses transfer clocks faster than the emulation clocks may also be used in combination.

In addition, in the present exemplary embodiment, it is assumed that there is no delay in transmission/reception of transfer signals, such that reception in the reception side sub-system comes to a close when the communication of the transfer signal has come to a close. However, in the emulator with concomitant transfer delay, such a signal indicating the end of reception may be transmitted from the receiving side after the end of reception at the receiving side.

The advantages to be brought about by the logic circuit emulator 20 of the present exemplary embodiment may now be summarized.

In the present exemplary embodiment, the emulation clock cycle offsets between different sub-systems are tolerated provided that the global processing integrity is maintained. By tolerating the offsets, it is only between different sub-systems neighbored to each other from the perspective of signal coupling that an emulation clock controlling signal is to be transmitted/received. Hence, control signal interconnects may be simplified and reduced in length in comparison with the system in which control signals from the total of the sub-systems are collected by a control circuit to control the emulation clocks of the entire sub-systems from the control circuit. This elevates the speed of the emulation clocks.

Moreover, in the logic circuit emulator 20 of the present exemplary embodiment, the respective sub-systems control the emulation clocks independently of one another. Such a sub-system in which the input signal is unchanged and the progressing of the emulation clocks is permitted by the total of the neighbored sub-systems may allow for progressing of the emulation clocks regardless of the presence/absence of the sub-system(s) involved in transfer signal transmission/reception. In this case, the frequency of the emulation clock may be the same as that of the legacy logic circuit emulator 100. Thus, with the logic circuit emulator 20 of the present exemplary embodiment, the emulation time may be reduced. It should be noted that, if faster emulation clocks are used, the emulation time may further be reduced.

(Third Exemplary Embodiment)

A logic circuit emulator according to a third exemplary embodiment will now be described in detail with reference to the drawings.

Figure 11:
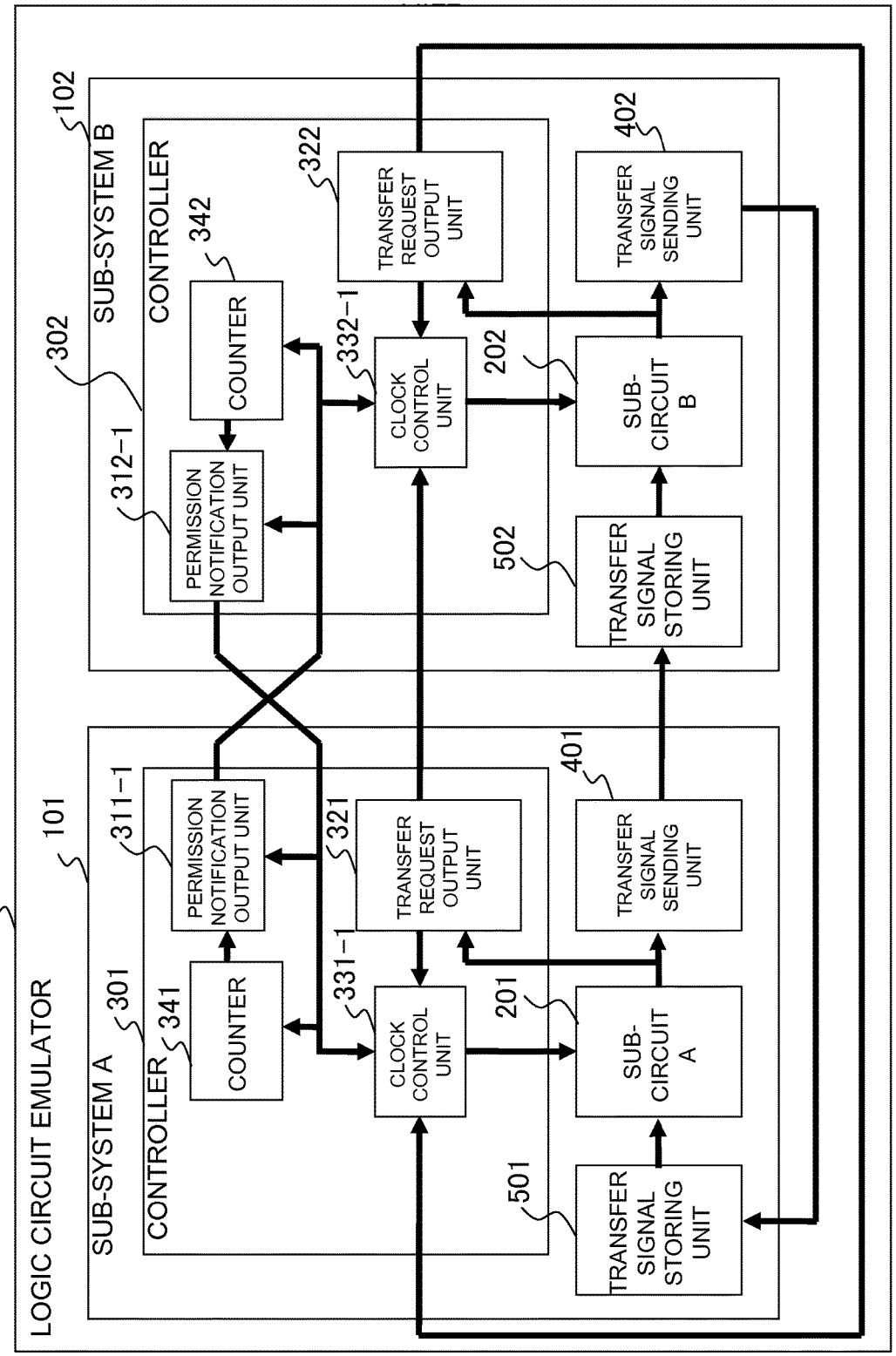
FIG. 11 is a block diagram showing a configuration of a logic circuit emulator according to a third exemplary embodiment.

FIG. 11 depicts a block diagram showing a configuration of a logic circuit emulator 30. Referring to FIG. 11, the logic circuit emulator 30 is similar to the logic circuit emulator 20 except including counters 341, 342.

Each of the counters 341, 342 holds on memory a numerical value calculated from state offset from the sub-system, among the neighbored sub-systems, which is the communication destination of the transfer signal. Hence, the counters are provided on the transfer signal output sides of the sub-systems. Here, such a case will hereinafter be explained in which the numerical value stored indicates the number of states by which it is possible to advance the sub-system as a communication destination of the transfer signal. This numerical value corresponds to the state shift from the neighbored sub-system plus one. Hence, permission notification output units 311-1, 311-2 output permission notifications to the communication destination of the transfer signal in case the counters 341, 342 hold count values not less than one.

Even in case no permission notification is output from the sub-system of the communication destination of the transfer signal, but there is no change in the output signal of the verification target circuit partition, clock control units 331-1, 331-2 output emulation clocks. The logic circuit emulator 30 differs in this respect from the logic circuit emulator 20 of the second exemplary embodiment.

Figure 12:
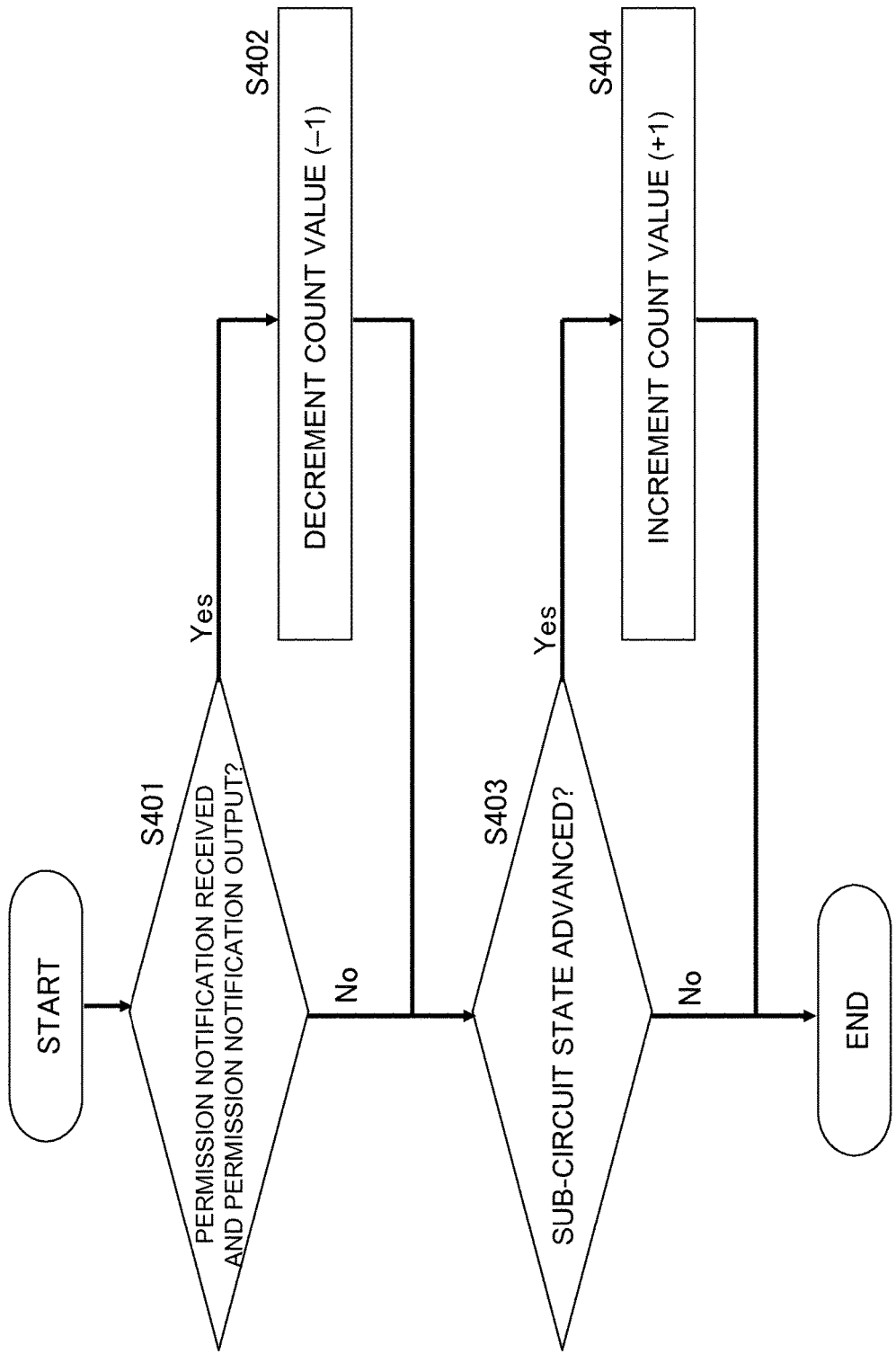
FIG. 12 is a flowchart showing an operation of a counter in the logic circuit emulator according to the third exemplary embodiment.

FIG. 12 depicts a flowchart showing an operation of the counters in the logic circuit emulator 30 according to the present exemplary embodiment. The operation of the counters 341, 342 will now be described with reference to the flowchart of FIG. 12.

The following explanation will be made with the use of the counter 341 on the sub-system A101, with the sub-system A101 as the transmitting side and with the sub-system B102 as the receiving side. The processing, now explained, is carried out every time interval. Note that one time interval corresponds to one cycle time of the emulation clock, and that the counter increment or decrement, as calculated with the subject flowchart, is reflected in the count values as time elapses to the next time intervals.

The counter 341 checks the state of the permission notifications of the sub-systems A101 and B102 (step S401). Initially, such a case in which a permission notification has been received from the sub-system B102 and a permission notification is output from the sub-system A101 (YES of step S401) is now scrutinzed. Such a state in which the permission notification has been received from the sub-system B102 indicates that the sub-system B102 advanced by one state during the directly previous time interval. It is now assumed that, if the state of the sub-system A101 is not advanced, the number of states by which the sub-system B102 may be advanced forwards decreases by one. Hence, the count value of the counter 341 is decremented (−1).

On the other hand, if no permission notification is output in this case from the sub-system A101, the sub-system B102 keeps on outputting the permission notification regardless of whether or not the state of the sub-system B102 has advanced. Hence, no decision may be made based solely on that the permission notification has been received from the sub-system B102. It is only when the sub-system A101 has output the permission notification that the sub-system A101 may receive the permission notification from the sub-system B102 to proceed with processing. Hence, if the permission notification has been received from the sub-system B102, and the permission notification is output from the sub-system A101, the counter 341 decrements its count value (−1) in step S402 to transfer to step S403.

If otherwise (NO of step S401), processing moves to step S403 without decrementing the count value.

The counter 341 then checks whether or not the state of the sub-circuit A201 is advanced as time elapses from the current time interval to the next time interval (step S403). This check may be made based on whether or not the clock control unit 331 outputs an emulation clock. In case the state of the sub-circuit A201 is advanced (YES of step S403), it is possible for the sub-circuit B202 on the sub-system B102 to advance a further one state. Hence, the counter 341 increments its count value (+1) (step S404).

If the state is not advanced (NO of step S403), processing comes to a close.

Taking an example case where four sub-systems are run in concert, the global operation of the logic circuit emulator 30 according to the present exemplary embodiment will now be set out.

Figure 13:
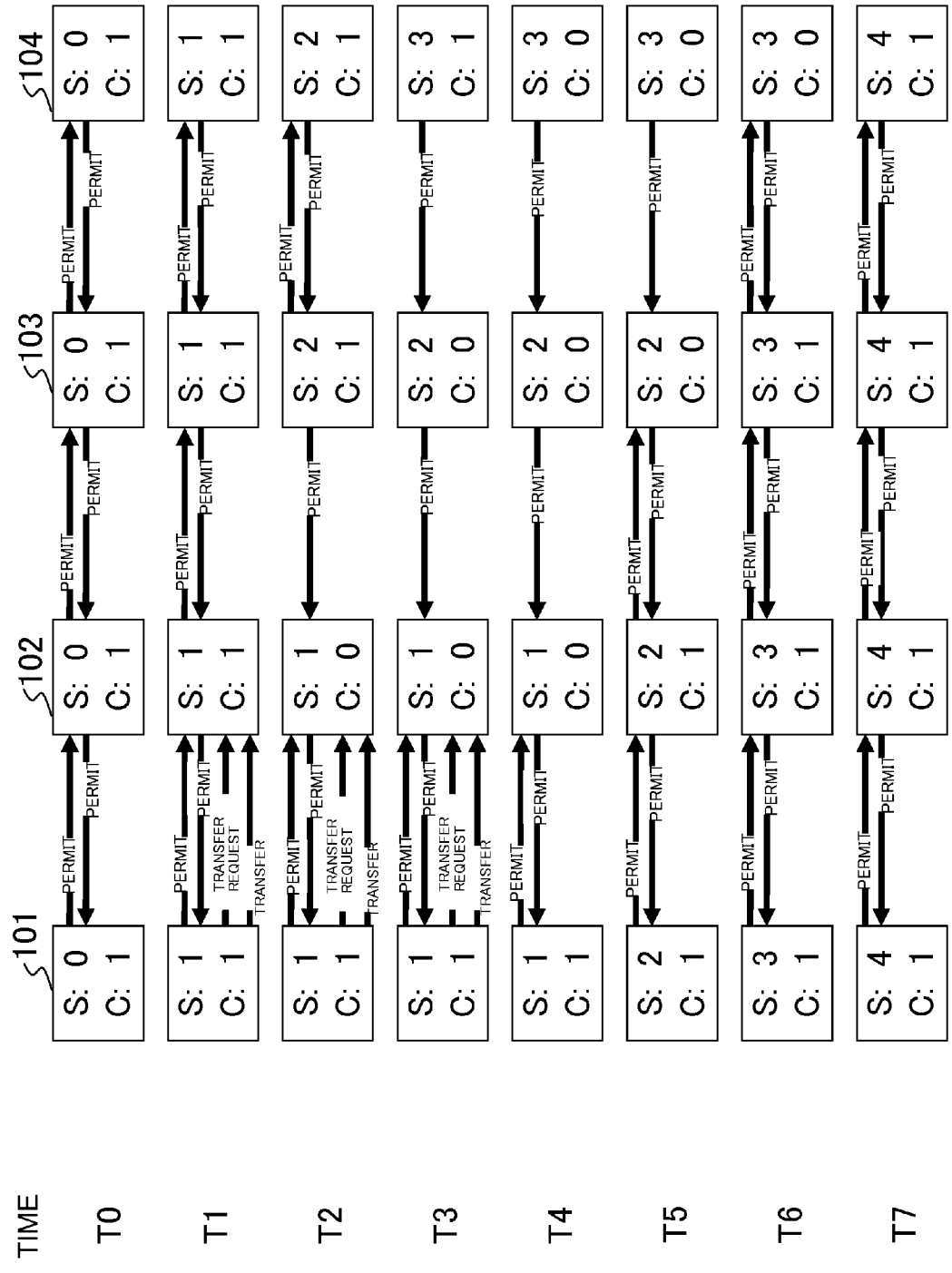
FIG. 13 is a schematic view showing an entire operation of the logic circuit emulator according to the third exemplary embodiment.

In FIG. 13, T0, T1, ..., T7 denote time intervals, each of which is equivalent to time duration corresponding to an emulation clock cycle. The respective columns to the right of the time column represent the states of the sub-systems 101 to 104 in each time interval.

S:0, S:1, ..., S:4 within the rectangle symbols of the sub-systems respectively denote a non-advanced state, a state advanced by one cycle, ..., a state advanced by four cycles, of the emulation clocks of the sub-systems.

C:0, C:1 within each rectangle symbol of the sub-system denote count values held by the counters. Note that the numerals within the rectangles C:0 and C:1 denote the numbers of states by which it is possible to advance the sub-system of the communication destination of the transfer signal.

In general, the transfer signal is bi-directional and coupled to a plurality of sub-systems. It is here assumed, for simplicity sake, that the signal is to be transferred unidirectionally from the left-side sub-system 101 to the right-side sub-system 104 in FIG. 13.

Such a case is now scrutinized in which an output signal of the sub-system 101 in the state S:1, an input signal to the sub-system 101, has changed such that there is produced transmission/reception of a transfer signal in need of transfer time of three emulation clocks for the sub-system 102.

Referring to FIG. 13, the count value of each counter is initialized at 1 in time interval T0, such that each counter outputs a permission notification. Since no transmission/reception of the transfer signal occurs at this time, each sub-system advances to the state S:1 in a time interval T1.

In time interval T1, it becomes necessary for the sub-system 101, now set to the state S:1, to send the transfer signal to the sub-system 102. The sub-system 101 thus outputs a transfer request to the sub-system 102, while commencing the signal transfer. The state of the sub-system 101 is not advanced as time elapses to time interval T2. Note that, since a transfer request is put from the sub-system 101, the sub-system 102 commences receiving the signal. The state of the sub-system 102 is not advanced as time elapses to time interval T2. Also, at this time, the count value of the counter of the sub-system 102 is zero, in accordance with the flowchart of FIG. 12, as time elapses to time interval T2. There is no transfer request, and a permission notification is output, between the sub-systems 102 and 103 or between the sub-systems 103, 104. Hence, the sub-systems 103, 104 advance to the state S:2 as time elapses to time interval T2.

In time interval T2, signal transmission/reception is continued between the sub-systems 101 and 102. Hence, the states of the sub-systems 101, 102 are not advanced as time elapses to time interval T3. On the other hand, as from the time the permission notification was made between the sub-systems 101 and 102, the sub-systems 101 and 102 are involved in transmission/reception, that is, the states of the sub-systems 101 and 102 may not be advanced. Hence, the count value of the counter of the sub-system 101 remains at one in accordance with the flowchart shown in FIG. 12. The permission notification thus keeps on being output. In similar manner, the permission notification from the sub-system 102 to the sub-system 101 keeps on being output in accordance with the flowchart of FIG. 6. At this time, the sub-systems 103 and 104 keep on outputting permission notifications as before. However, since the count value of the counter of the sub-system 102 is zero, no permission notification is output from the sub-system 102 to the sub-system 103. Hence, the state of the sub-system 103 is not advanced as time elapses to time T3. On the other hand, the sub-system 104 advances to the state S:3.

The time corresponding to three emulation clocks is needed for the outstanding signal transmission/reception. Thus, in time interval T3, the signal transmission/reception is continued between the sub-systems 101 and 102. As in time interval T2, the states of the sub-systems 101, 102 are not advanced as time elapses to time interval T4. Since the state of the sub-system 103 has not advanced this time, the count value of the counter of the sub-system 103 is zero, so that no permission notification is output to the sub-system 104. On the other hand, as from the time the permission notification was made, the state of the sub-system 102 is not advanced. That is, the sub-system 102 outputs no permission notification to the sub-system 103, while no permission notification from the sub-system 103 is received by the sub-system 102. Hence, the permission notification from the sub-system 103 to the sub-system 102 continues to be output, in accordance with the flowchart of FIG. 6. The sub-system 104 outputs the permission notification as before. At this time, no permission notification is output from the sub-system 103 to the sub-system 104. Hence, the state of the sub-system 104 is not advanced as time elapses to time interval 104.

In time interval T4, transmission/reception of the transfer signal comes to a close. The sub-system 101 stops putting a transfer request on the sub-system 102. Hence, the sub-systems 101, 102 advance to the state S:2 as time elapses to time T5. On the other hand, the counter of the sub-system 102 becomes one, in accordance with the flowchart of FIG. 12, as time elapses to time interval T5. The states of the sub-systems 103, 104 are not advanced.

In time interval T5, the sub-systems 101, 102 output permission notifications. Hence, the sub-systems 101 to 103 are advanced to the state S:3 as time elapses to time interval T6. On the other hand, the count value of the counter of the sub-system 103 becomes one, in accordance with the flowchart of FIG. 12, as time elapses to time interval T6. The state of the sub-system 104 is not advanced.

In time intervals T6 and T7, the output signal of the verification target circuit partition on each sub-system is not changed. Hence, the sub-systems reciprocally output permission notifications, and shift to the state S:4 and thence to the state S:5, in keeping up with the progressing of the emulation clocks, as time elapses to the next time intervals.

In this manner, state progress control similar to that in the second exemplary embodiment of FIG. 8 may be exercised in the system of the third exemplary embodiment making use of the counters.

Figure 14:
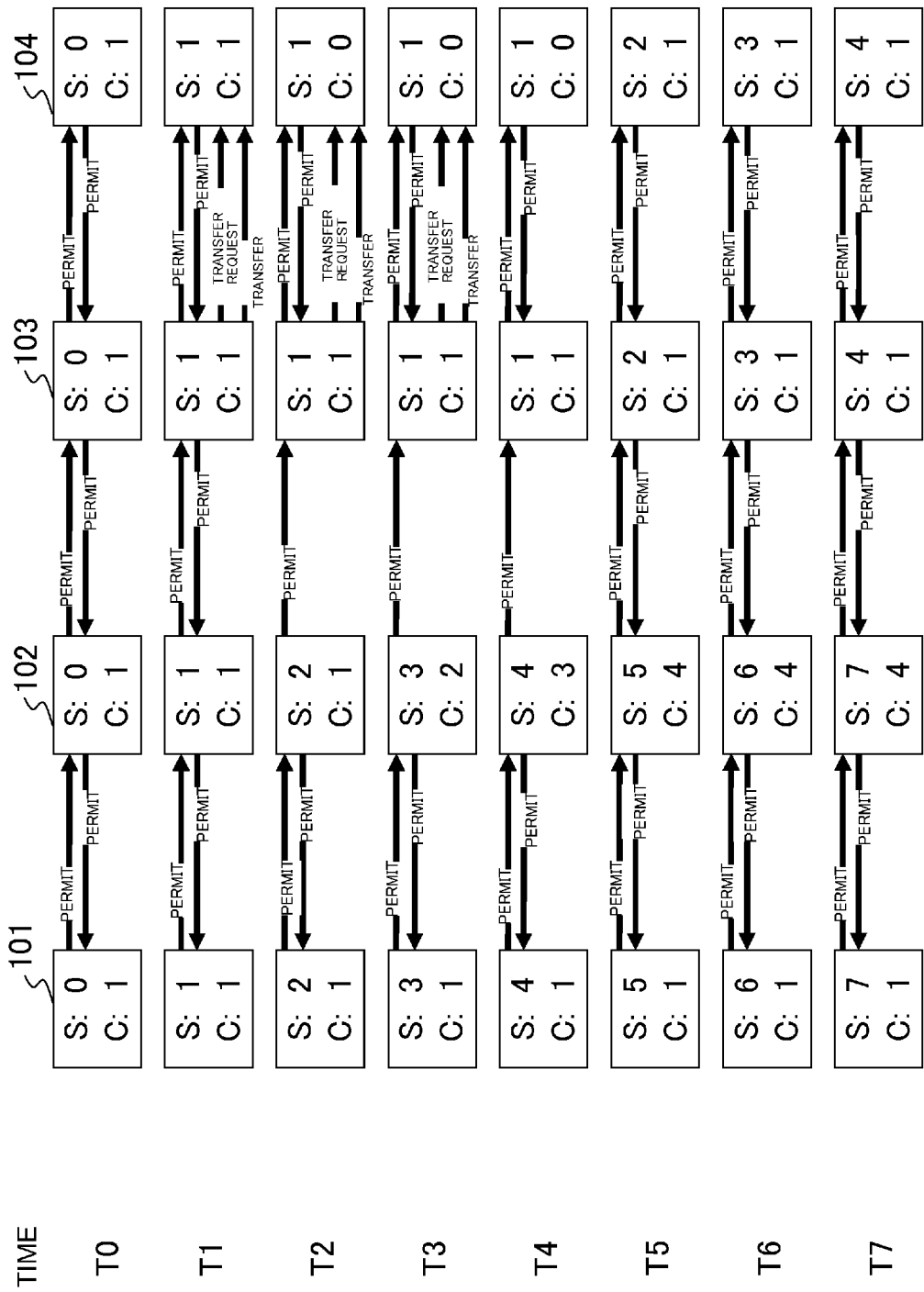
FIG. 14 is also a schematic view showing an entire operation of the logic circuit emulator according to the third exemplary embodiment.

FIG. 14 shows such a case where an output signal of the sub-system 103 in the state S:1, an input signal to the sub-system 104, has changed, such that there occurs transmission/reception of the transfer signal which is in need of transfer time of three emulation clock cycles for the sub-system 104.

Referring to FIG. 14, each counter is initialized at one in time interval T0 and each sub-system outputs a permission notification. At this time, no transmission/reception of the transfer signal occurs, so that, in time interval T1, each sub-system advances to the state S:1.

In time interval T1, it becomes necessary for the sub-system 103, now set to the state S:1, to send a transfer signal to the sub-system 104. Hence, the sub-system 103 outputs a transfer request to the sub-system 104, which then commences to transfer the signal. The state of the sub-system 103 is not advanced as time elapses to time T2. The sub-system 104 receives the transfer request, sent from the sub-system 103, and hence commences receiving the signal. The state of the sub-system 104 is not advanced as time elapses to time interval T2. Since no transfer request is made between the sub-systems 101 and 102 or between the sub-systems 102 and 103, permission notification is output to each of these sub-systems. Hence, the sub-systems 101, 102 advance to the state S:2 as time elapses to time interval T2.

In time interval T2, signal transmission/reception is continued between the sub-systems 103, 104. On the other hand, the states of the sub-systems 103, 104 are not advanced as time elapses to time interval T3. Moreover, as from the time the permission notification was made between the sub-systems 103, 104, the sub-systems 103, 104 are involved in signal transmission/reception (the states of the sub-systems 103, 104 may not be advanced). Hence, the count value of the counter of the sub-system 103 keeps on being one in accordance with the flowchart of FIG. 12. The permission notification thus keeps on being output. Similarly, the permission notification from the sub-system 104 to the sub-system 103 keeps on being output in accordance with the flowchart of FIG. 6. The subsystems 101, 102 output the permission notifications as before. At this time, no permission notification is output from the sub-system 103 to the sub-system 102. However, in the logic circuit emulator 30 of the third exemplary embodiment, the sub-system 103 is advanced to the state S:3 as time elapses to time interval T3.

By holding on memory by how many emulation clock cycles the verification target circuit partition in question has advanced, the verification target circuit partitions may be advanced to forward states beforehand, as global integrity is maintained, insofar as the output of the verification target circuit is unchanged. The logic circuit emulator of the present exemplary embodiment exploits this feature. The logic circuit emulator 30 of the present exemplary embodiment differs in this respect from the logic circuit emulator 20 of the second exemplary embodiment in which the state of the sub-system 102 is not advanced as time elapses to time interval T3.

At this time, the state offset of the sub-system 102 from the sub-system 103 increases. Thus, the count value of the counter in time interval T3 increases to two in accordance with the flowchart of FIG. 12. The sub-system 103 advances to the state S:3 through.

The outstanding transmission/reception is in need of time equivalent to three emulation clocks. Thus, in the time interval T3, signal transfer is continued between the sub-systems 103 and 104. On the other hand, the sub-systems 101, 102 are advanced to the state S:4, as time elapses to time interval T4, as in the time interval T2. The count value of the counter of the sub-system 102 increases to three.

In the time interval T4, transmission/reception of the transfer signal comes to a close. The sub-system 103 thus stops making the transfer request to the sub-system 104. Hence, the sub-systems 103, 104 are advanced to the state S:2 as time elapses to time interval T5. The sub-systems 101, 102 are advanced to the state S:5 as time elapses to time interval T5. The count value of the counter of the sub-system 102 increases to four.

In the time intervals T5 to T7, the output signal of each sub-system is unchanged. Hence, the sub-systems reciprocally output permission notifications and are advanced to states conforming to the progressing of the emulation clocks. At this time, the states of the sub-systems 101, 102 are S:5 to S:7, while those of the sub-systems 103, 104 are S:2 to S:4. That is, the processing goes on as an offset of three states has been produced. At this time, a count value equal three as offset of three states plus one equal to four is held by the counter on the sub-system 102.

The advantages to be brought about by the logic circuit emulator 30 of the present exemplary embodiment will now be described.

The logic circuit emulator 30 of the present exemplary embodiment, provided with the counter, holds on memory how many emulation clock cycle offsets there are from the sub-system of the communication destination of the transfer signal. By holding on memory how many emulation clock cycle offsets there are as compared to the sub-system as the communication destination of the transfer signal, the verification target circuit partitions may be advanced to forward states beforehand, as global integrity is maintained, provided that the output of the verification target circuit is unchanged.

The logic circuit emulator 30 of the present exemplary embodiment exploits this characteristic, so that, even in case the state of the transfer signal communication destination may not be advanced forwards, the offset of the states is held on memory by the counter to advance the states beforehand. Thus, when the sub-system of the subsequent stage is at a standstill due to transmission/reception of the transfer signal or the like, the states of the pre-stage sub-systems may be advanced forwards. As the subsequent stage sub-systems catch up with the pre-stage sub-systems, these pre-stage sub-systems may commence a further transfer operation. Thus, in the logic circuit emulator 30 of the present exemplary embodiment, the emulation time may be further reduced in comparison with the logic circuit emulator 20 of the second exemplary embodiment.

(Fourth Exemplary Embodiment)

A logic circuit emulator according to a fourth exemplary embodiment will now be set out in detail with reference to the drawings.

In a logic circuit emulator 40 of the present exemplary embodiment, the transfer signal sending units 401, 402 and the transfer signal storing units 501, 502 in the logic circuit emulator 20 of the second exemplary embodiment are provided within controllers 301, 302, respectively. In addition, there are provided processors, as set out later, for controlling these components.

Figure 15:
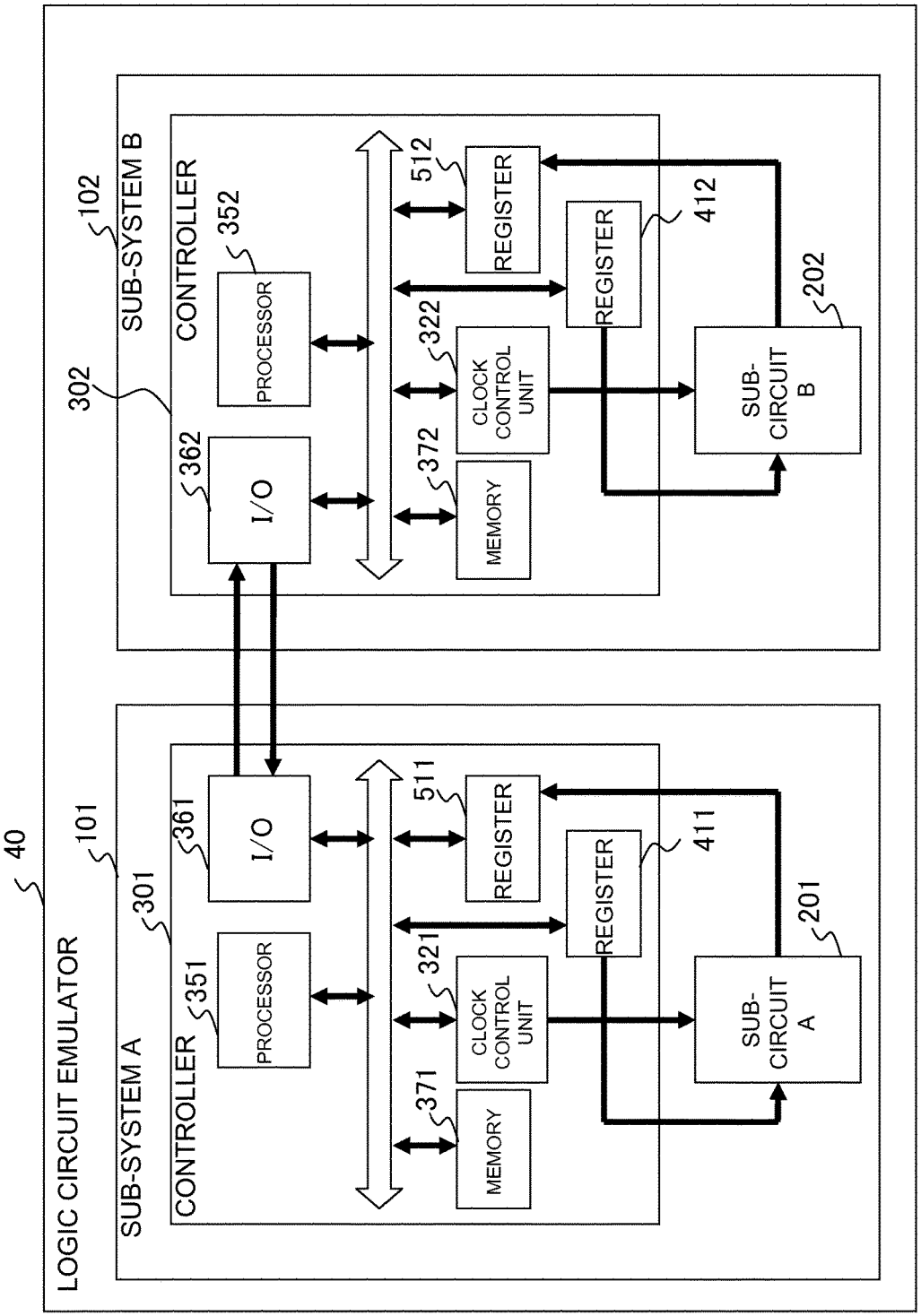
FIG. 15 is a block diagram showing a configuration of a logic circuit emulator according to a fourth exemplary embodiment.
Figure 16:
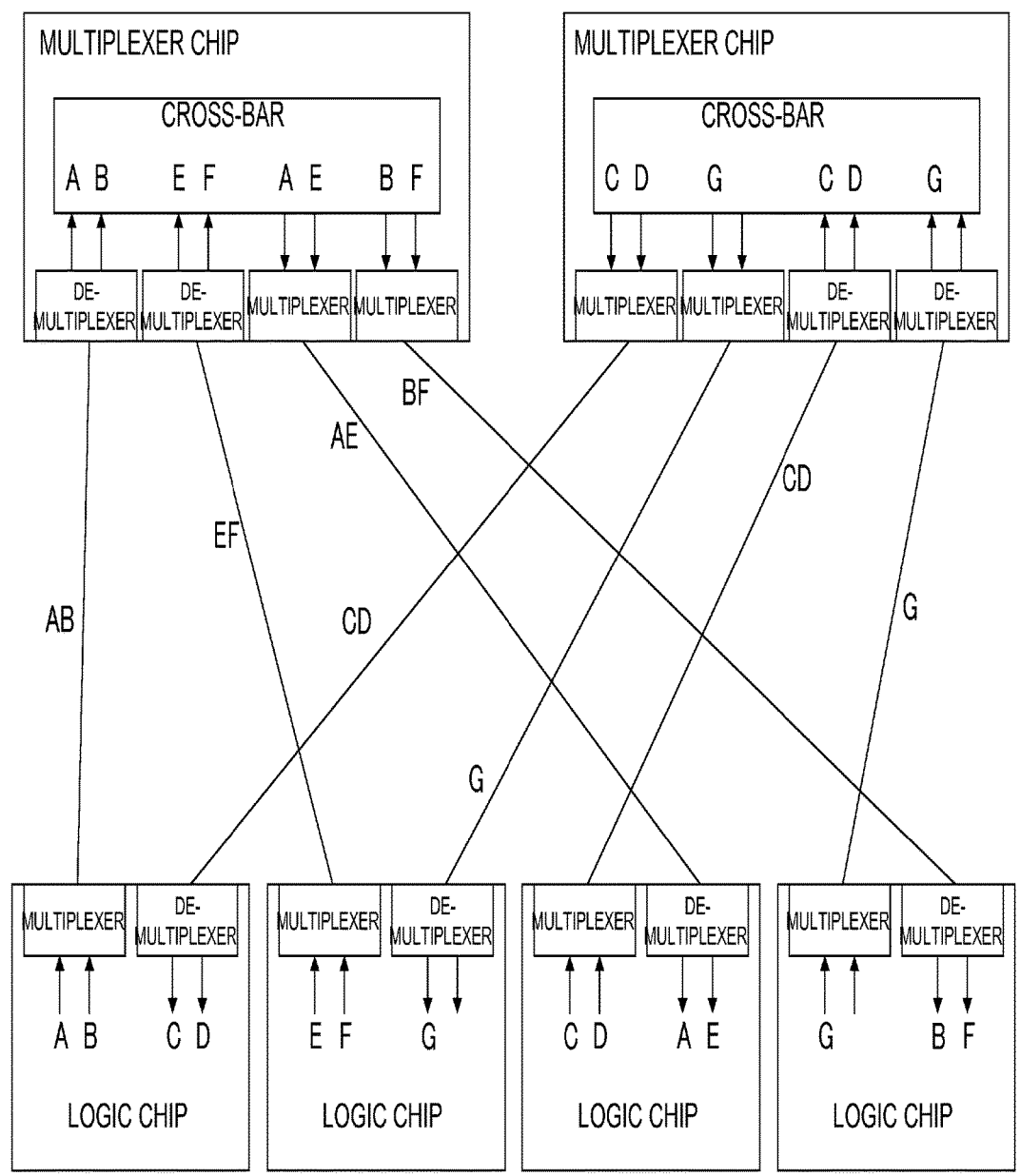
FIG. 16 is a block diagram showing a configuration of an emulation system making use of time-multiplexed interconnections as set out in Patent Literature 1.
Figure 17:
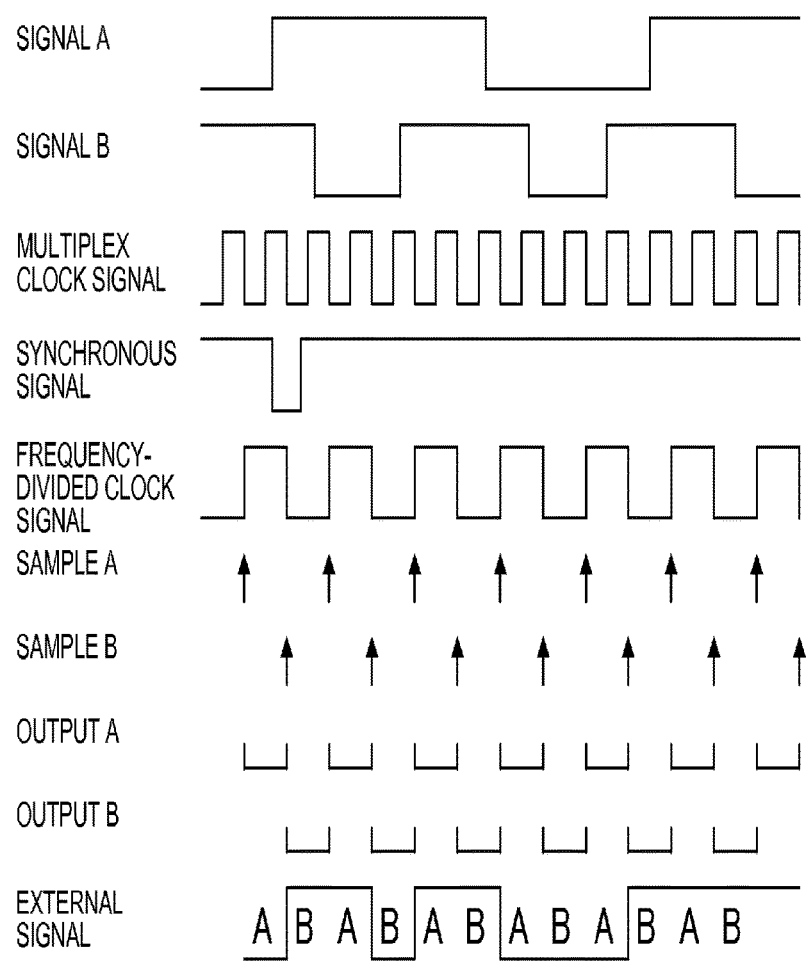
FIG. 17 is a waveform diagram showing an operation of the emulation system making use of time-multiplexed interconnections as set out in Patent Literature 1.
Figure 18:
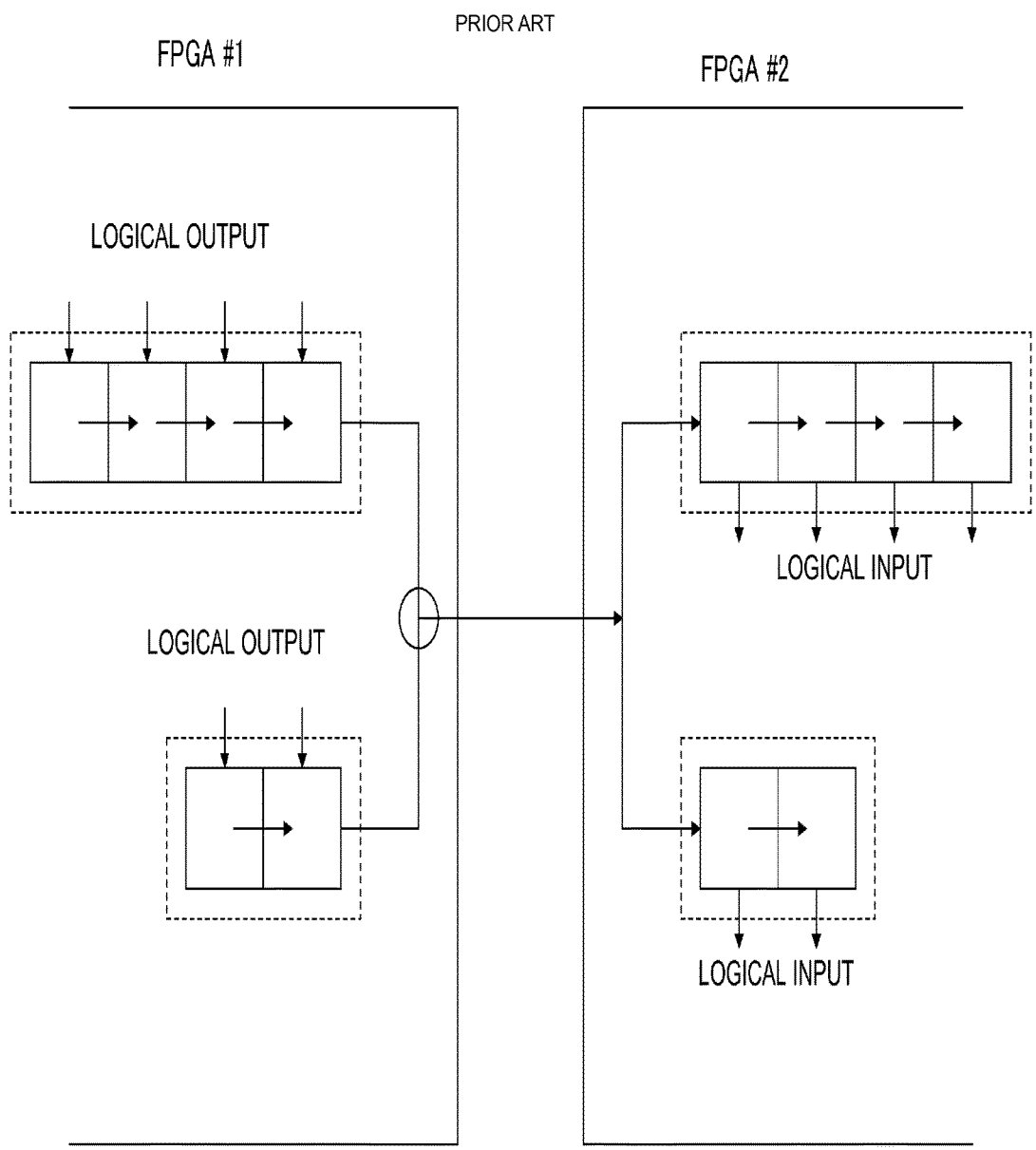
FIG. 18 is a block diagram showing a configuration of virtual interconnections for a reconfigurable logic system as set out in Patent Literature 2.
Figure 19:
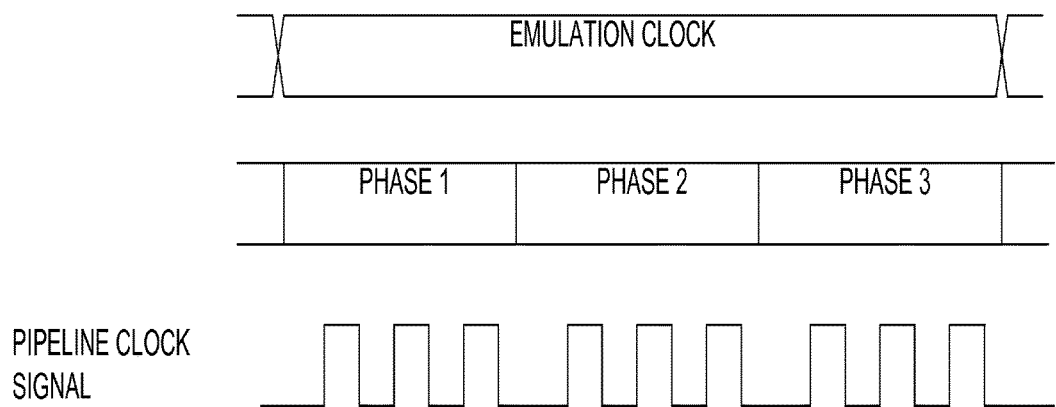
FIG. 19 is a block diagram showing an operation of virtual interconnections for a reconfigurable logic system as set out in Patent Literature 2.

FIG. 15 depicts a block diagram showing a configuration of the logic circuit emulator 40 of the present exemplary embodiment. The logic circuit emulator 40 includes sub-systems A101, B102. Although the logic circuit emulator 40 including two sub-systems will now be set out, the logic circuit emulator 40 of the present exemplary embodiment is not restrictively applied to a configuration including two sub-systems and may apply to cases including an optional number of sub-systems as well.

Referring to FIG. 15, the sub-system A101 includes a controller 301 and a verification target circuit partition 201. The controller 301 includes a processor 351, an I/O 361, a memory 371, a clock control unit 321, and registers 411, 511. Similarly, the sub-system B102 includes a controller 302 and a verification target circuit partition 202. The controller 302 includes a processor 352, an I/O 362, a memory 372, a clock control unit 322, and registers 412, 512.

A sub-circuit A201 and a sub-circuit B202 are obtained on partitioning the verification target circuit, about to be verified by a designer, and on configuring the so partitioned circuit partitions on the sub-systems A101, B102. The verification target circuit may be partitioned using a suitable off-the-shelf CAD tool or the like.

The controllers 301, 302 manage the input and output signals of the sub-circuits A201, B202, and control emulation clocks that set the sub-circuits A201, B202 in operation. By so doing, the partitioned verification target circuit is run in operation as integrity is maintained.

The inner sides of the controllers 301, 302 will now be set out.

The processor 351 reads out from or records on the clock control unit 321, I/O 361, memory 371 and the registers 411, 511, in response to a program, such as to control the sub-circuit A201. Similarly, the processor 352 reads out from or records on the clock control unit 322, I/O 362, memory 372 and the registers 412, 512, in response to a program, such as to control the sub-circuit B202.

The I/Os 361, 362 send/receive control signals between neighbored sub-systems to send output signals of the verification target circuit partitions to the neighbored sub-systems.

The memories 371, 372 hold instruction program codes of the processors, data and so forth.

The registers 411, 412 are used in place of the transfer signal sending units 401, 402, respectively. The registers 411, 412 receive output signals of the sub-circuit A201 and the sub-circuit B202, respectively, and are configured for being referenced from the processors.

The registers 511, 512 are used in place of the transfer signal storing units 501, 502, respectively. The registers 511, 512 are configured for being programmable from the processors and hold input signals to the sub-circuit A201 and the sub-circuit B202, respectively.

An operation of the logic circuit emulator 40 of the present exemplary embodiment is similar to that of the logic circuit emulators 20, 30 of the second and third exemplary embodiments except that the processing is carried out by the processors 351, 352 based on a program, not shown.

The advantages to be brought about by the logic circuit emulator 40 of the present exemplary embodiment will now be set out.

In the logic circuit emulator 40 of the present exemplary embodiment, the control managed by the controllers 301, 302 in the logic circuit emulators 20, 30 of the second and third exemplary embodiments is implemented by the processors 351, 352, respectively. Thus, in the logic circuit emulator 40 of the present exemplary embodiment, the control system may be varied by changing the program such as to customize the control in keeping with the characteristic of the verification target circuit.

In the logic circuit emulators 10, 20, 30 and 40 of the first to fourth exemplary embodiments, described above, there are provided a plurality of sub-systems, and the logic circuit being verified is divided into a plurality of sub-circuits. Each sub-circuit is loaded on each of the multiple sub-systems for verification.

The first sub-system, a signal output side, includes a permission notification output unit that sends a notification to permit the progressing of the emulation clocks to the second sub-system.

The second sub-system, a signal receiving side, includes a permission notification output unit that sends out a notification that permits progressing of emulation clocks to the first sub-system.

The first sub-system also includes a transfer signal sending unit that receives a transfer signal to send out the transfer signal to the second sub-system. The transfer signal is a signal sent from a first verification target circuit partition allocated to the first sub-system to a verification target circuit partition allocated to the second sub-system.

The second sub-system includes a transfer signal storing unit that holds the transfer signal, received from the transfer signal sending unit, as an input to the second verification target circuit partition on the second sub-system.

The first sub-system includes a transfer signal output unit that detects an output change in a transfer signal sent from the first sub-system to the second sub-system and that makes a transfer request in case such output change has occurred. The transfer request and the permission notification are sent to a clock control unit configured on each of the first and second sub-systems. The clock control unit exercises control of stopping the emulation clock during the time until the second sub-system completes reception of the transfer signal and during the time the permission notification has not been received.

The permission notification output unit and the clock control unit manage emulation clock control independently from one sub-system to the next, and proceed with the operation of the verification target circuit, as the emulation clock cycle offsets between the different sub-systems are tolerated, insofar as integrity of the entire system is maintained.

With the logic circuit emulators 10, 20, 30 and 40 of the above described exemplary embodiments, emulation clock control may be managed for the verification target circuit independently from one sub-system to the next to tolerate emulation clock cycle offsets between the different sub-systems insofar as integrity of the entire system is maintained.

On comparison, the logic circuit emulators 10, 20, 30 and 40 of the above described exemplary embodiments differ from the configuration of the logic circuit emulator 100, shown in FIG. 20, in not having the global control circuit 990 and in the respective sub-systems making permission notifications to the neighbored sub-systems. In such configuration, control may be managed such that emulation clock cycle offsets between the different sub-systems will be tolerated insofar as integrity of the entire system is maintained.

The logic circuit emulators 10, 20, 30 and 40 of the above described exemplary embodiments may, for example, be applied to clock control for real systems in which a logic circuit is run in operation as it is divided into a plurality of chips.

The disclosure of the above Patent Literatures is incorporated herein by reference thereto. Modifications and adjustments of the exemplary embodiment are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept. Particularly, any numerical range disclosed herein should be interpreted that any intermediate values or subranges falling within the disclosed range are also concretely disclosed even without specific recital thereof.

The above exemplary embodiments may be set out, in part or in their entirety, as the following examples of execution, which are given only for illustration and not intended for limiting the invention.

(Example of Execution 1)
A logic circuit emulator comprising:
a plurality of sub-systems each of which is provided with one of a plurality of sub-circuits obtained on partitioning a verification target circuit, wherein
each of the plurality of sub-systems includes:
a permission notification output unit that, depending on whether or not a state of a sub-circuit provided in an own sub-system has advanced, outputs to another sub-system a permission notification that permits the another sub-system to advance to a next emulation clock cycle;
a transfer request output unit that, in case a signal that is output from a sub-circuit provided in the own sub-system and that is to be sent to a sub-circuit provided in another sub-system has changed, outputs to the another sub-system before the next emulation clock cycle a transfer request to transfer the signal; and
a clock control unit that, in case a signal from the sub-circuit provided in the own sub-system to a sub-circuit provided in another sub-system is not being sent, a permission notification is received but no transfer request is received from another sub-system, outputs an emulation clock signal for the sub-circuit provided in the own sub-system to advance the sub-circuit provided in the own sub-system to a next emulation clock cycle.

(Example of Execution 2)
The logic circuit emulator according to example of execution 1, wherein
in case the clock control unit has output the emulation clock signal, the permission notification output unit determines that the state of the sub-circuit provided in the own sub-system has advanced.

(Example of Execution 3)
A logic circuit emulator comprising:
a first sub-system provided with a first sub-circuit among a plurality of sub-circuits obtained on partitioning a verification target circuit; and
a second sub-system provided with a second sub-circuit [among the plurality of sub-circuits] that sends a signal to or receives a signal from the first sub-circuit, wherein
each of the first sub-system and the second sub-system includes:
a permission notification output unit that, depending on whether or not a state of a sub-circuit provided in an own sub-system has advanced, outputs to the other sub-system a permission notification that permits the other sub-system to advance to a next emulation cycle;
a transfer request output unit that, in case a change in a signal sent from the sub-circuit provided in one of the first and second sub-systems to the sub-circuit provided in the other sub-system is detected, outputs to the other thereof before a next emulation clock cycle a transfer request to transfer the signal; and
a clock control unit that, in case a permission notification is received but no transfer request is received from the other sub-system, outputs an emulation clock signal to the sub-circuit provided in the one of the first and second sub-systems to advance the sub-circuit concerned provided in the one sub-system to a next emulation clock cycle.

(Example of Execution 4)
The logic circuit emulator of the example of execution 3, wherein the permission notification output unit and the clock control unit manage control to allow for emulation clock cycle offsets between the different sub-circuits.

(Example of Execution 5)
The logic circuit emulator of the example of execution 3 or 4, wherein the permission notification output unit outputs the permission notification based on whether or not the state of the sub-circuit in one of the first and second sub-systems has advanced.

(Example of Execution 6)
The logic circuit emulator of any one of the examples of execution 3 to 5, wherein
the permission notification output unit determines whether or not the state of the sub-circuit provided in one of the first and second sub-systems has advanced, based on whether or not the clock control unit has output a clock.

(Example of Execution 7)
The logic circuit emulator of any one of the examples of execution 1 to 6, wherein
each of the first and second sub-systems includes a counter that holds a count value calculated from an emulation clock cycle offset between the first and second sub-systems.

(Example of Execution 8)
The logic circuit emulator of the example of execution 7, wherein the counter holds as the count value a count value that is obtained by adding one to a value equal to the emulation clock cycle offset.

(Example of Execution 9)
The logic circuit emulator of the example of execution 8, wherein the permission notification output unit outputs the permission notification in case a count value stored in the counter is not less than one.

(Example of Execution 10)
The logic circuit emulator of any one of the examples of execution 3 to 9, wherein
the first sub-system further includes a transfer signal sending unit that sends the transfer signal to the second sub-system.

(Example of Execution 11)
The logic circuit emulator of any one of the examples of execution 3 to 10, wherein
the second sub-system further includes a transfer signal storing unit that holds the transfer signal received from the transfer signal sending unit as an input to the sub-circuit on the second sub-system.

(Example of Execution 12)
A method for controlling a logic circuit emulator, including a plurality of sub-systems each of which is provided with one of a plurality of sub-circuits obtained on partitioning a verification target circuit, the method comprising:
by each of the plurality of sub-systems, depending on whether or not a state of a sub-circuit provided in one of the sub-systems has advanced, outputting to another sub-system a permission notification that permits the another sub-system to advance to a next emulation clock cycle;
in case a signal that is output from the sub-circuit provided in the one of the sub-systems and that is to be sent to the sub-circuit provided in the another sub-system has changed, outputting to the another sub-system, before a next emulation clock cycle, a transfer request to transfer the signal; and in case a signal from the sub-circuit provided in one of the sub-systems to the sub-circuit provided in the another sub-system is not being sent, the permission notification is received but no transfer request is received from any other sub-system, controlling the clock signal for the sub-circuit provided in the one sub-system so that the sub-circuit provided in the one sub-system be advanced to a next emulation clock cycle.

(Example of Execution 13)

A program for controlling a logic circuit emulator including a plurality of sub-systems each of which is provided with one of a plurality of sub-circuits obtained on partitioning a verification target circuit; the program causing a processor provided on each of the sub-systems to execute:

depending on whether or not a state of a sub-circuit provided in one of the sub-systems has advanced, outputting to another sub-system a permission notification that permits the another sub-system to advance to a next emulation clock cycle;

in case a signal that is output from the sub-circuit provided in the one of the sub-systems and that is to be sent to the sub-circuit provided in the another sub-system has changed, outputting to the another sub-system, before a next emulation clock cycle, a transfer request to transfer the signal; and in case a signal from the sub-circuit provided in the one of the sub-systems to the sub-circuit provided in the another sub-system is not being sent, the permission notification is received but no transfer request is received from any other sub-system, controlling the clock signal for the sub-circuit provided in the one sub-system so that the sub-circuit provided in the one sub-system be advanced to a next emulation clock cycle.

REFERENCE SIGNS LIST 10, 20, 30, 40, 100 logic circuit emulator
11, 101 sub-system A
12, 102 sub-system B
21, 201 sub-circuit A
22, 202 sub-circuit B
31, 32, 311, 312, 311-1, 312-1 permission notification output unit
41, 42, 321, 322 transfer request output unit
41, 52, 331, 332, 331-1, 332-1, 931, 932 clock control unit
103 sub-system C
104 sub-system D
301, 302 controller
341, 342 counter
351, 352 processor
361, 362 I/O
371, 372 memory
401, 402 transfer signal sending unit
411, 412, 511, 512 register
501, 502 transfer signal storing unit
990 global control circuit
991 transfer request receiving unit
992 permission notification output unit

The invention claimed is:

1. A logic circuit emulator, comprising:
a plurality of sub-systems each of which is provided with one of a plurality of sub-circuits obtained on partitioning a verification target circuit, wherein
each of the plurality of sub-systems includes:
a permission notification output unit that, if a state of a sub-circuit provided in the each sub-system has advanced, outputs to another sub-system a permission notification for permitting the another sub-system to advance to a next emulation clock cycle;
a transfer request output unit that, if a signal that is output from a sub-circuit provided in the each sub-system and that is to be sent to a sub-circuit provided in another sub-system has changed, outputs to the another sub-system before the next emulation clock cycle a transfer request for transferring the signal from the each sub-system to the another sub-system; and
a clock control unit that, if a signal from the sub-circuit provided in the each sub-system to a sub-circuit provided in the another sub-system is not being sent, and a permission notification is received from the another sub-system but no transfer request is received from the another sub-system, outputs an emulation clock signal for the sub-circuit provided in the each sub-system to advance the sub-circuit provided in the each sub-system to a next emulation clock cycle, and that, if a signal from the sub-circuit provided in the each sub-system to a sub-circuit provided in the another sub-system is being sent, a permission notification is not received from the another sub-system, or transfer request is received from the another sub-system, terminates the emulation clock signal.

2. The logic circuit emulator according to claim 1, wherein
if the clock control unit has output the emulation clock signal, the permission notification output unit determines that the state of the sub-circuit provided in the each sub-system has advanced.

3. A logic circuit emulator, comprising:
a first sub-system provided with a first sub-circuit among a plurality of sub-circuits obtained on partitioning a verification target circuit; and
a second sub-system provided with a second sub-circuit among the plurality of sub-circuits that sends a signal to or receives a signal from the first sub-circuit, wherein
each of the first sub-system and the second sub-system includes:
a permission notification output unit that if a state of a sub-circuit provided in the each sub-system has advance, outputs to another sub-system a permission notification for permitting the another sub-system to advance to a next emulation step;
a transfer request output unit that, in case a change in a signal sent from the sub-circuit provided in one of the first and second sub-systems to the sub-circuit provided in the another sub-system is detected, outputs to the another sub-system before a next emulation clock cycle a transfer request for transferring the signal from the each sub-system to another sub-system; and
a clock control unit that, if a permission notification is received from the another sub-system but no transfer request is received from the another sub-system, outputs an emulation clock signal to the sub-circuit provided in the each sub-systems to advance the sub-circuit provided in the each sub-system to a next emulation clock cycle, and that, if a permission notification is not received from the another sub-system, or transfer request is received from the another sub-system, terminates the emulation clock signal.

4. The logic circuit emulator according to claim 3, wherein
the permission notification output unit and the clock control unit manage control to tolerate an emulation clock cycle offset between the first sub-circuit and the second sub-circuit.

5. The logic circuit emulator according to claim 3, wherein
the permission notification output unit outputs the permission notification depending on whether or not the state of the sub-circuit provided in the each sub-system has advanced.

6. The logic circuit emulator according to claim 3, wherein
the permission notification output unit determines whether or not the state of the sub-circuit provided in the each sub-system has advanced, based on whether or not the clock control unit has output an emulation clock signal.

7. The logic circuit emulator according to claim 3, wherein
each of the first and second sub-systems further includes a counter that holds a count value calculated from emulation clock cycle offset between the first and second sub-systems.

8. The logic circuit emulator according to claim 7, wherein
the counter holds as the count value a count value that is obtained by adding one to a value equal to the emulation clock cycle offset.

9. The logic circuit emulator according to claim 8, wherein
the permission notification output unit outputs the permission notification in case the count value stored in the counter is not less than one.

10. A method for controlling a logic circuit emulator, including a plurality of sub-systems each of which is provided with one of a plurality of sub-circuits obtained on partitioning a verification target circuit, the method comprising:

by each of the plurality of sub-systems, if a state of a sub-circuit provided in the each sub-system has advanced, outputting to another sub-system a permission notification for permitting the another sub-system to advance to a next emulation clock cycle;

if a signal that is output from the sub-circuit provided in the each sub-systems and that is to be sent to the sub-circuit provided in the another sub-system has changed, outputting to the another sub-system, before a next emulation clock cycle, a transfer request to transferring the signal from the each sub-system to the another sub-system; and if a signal from the sub-circuit provided in the each the sub-systems to the sub-circuit provided in the another sub-system is not being sent, the permission notification is received from the another sub-system but no transfer request is received from the another sub-system, outputting an emulation clock signal to the sub-circuit provided in the each sub-system to advance the sub-circuit provided in the each sub-system to a next emulation clock cycle, and , if a signal from the sub-circuit provided in the each sub-system to the sub-circuit provided in the another sub-system is being sent, the permission notification is not received from the another sub-system, or transfer request is received from the another sub-system, terminating the emulation clock signal.

11. The method for controlling a logic circuit emulator according to claim 10, further comprising:
if an emulation clock signal for the sub-circuit provided in the each sub-system has been output, determining that the state of the sub-circuit provided in the each sub-system has advanced.

* * * * *